United States Patent
Sugizaki

(10) Patent No.: US 10,319,764 B2
(45) Date of Patent: Jun. 11, 2019

(54) IMAGE SENSOR AND ELECTRONIC DEVICE

(71) Applicant: SONY CORPORATION, Tokyo (JP)

(72) Inventor: Taro Sugizaki, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/580,356

(22) PCT Filed: Jun. 3, 2016

(86) PCT No.: PCT/JP2016/066570
§ 371 (c)(1),
(2) Date: Dec. 7, 2017

(87) PCT Pub. No.: WO2016/203990
PCT Pub. Date: Dec. 22, 2016

(65) Prior Publication Data
US 2018/0166488 A1    Jun. 14, 2018

(30) Foreign Application Priority Data
Jun. 18, 2015  (JP) ................................ 2015-122530

(51) Int. Cl.
*H01L 27/14* (2006.01)
*G02F 1/13* (2006.01)
(Continued)

(52) U.S. Cl.
CPC ........ *H01L 27/14625* (2013.01); *H01L 27/14* (2013.01); *H01L 27/146* (2013.01);
(Continued)

(58) Field of Classification Search
CPC ......... H01L 27/14625; H01L 27/14603; H01L 27/14623; H01L 27/14634;
(Continued)

(56) References Cited

U.S. PATENT DOCUMENTS 7,446,356 B2 * 11/2008 Misawa ............ H01L 27/14623
257/291
7,683,407 B2 * 3/2010 Boettiger .......... H01L 27/14625
257/292
(Continued)

FOREIGN PATENT DOCUMENTS

CN    103311259 A    9/2013
CN    103513440 A    1/2014
(Continued)

OTHER PUBLICATIONS

International Search Report and Written Opinion of PCT Application No. PCT/JP2016/066570, dated Aug. 23, 2016, 10 pages Of ISRWO.

*Primary Examiner* — Ida M Soward
(74) *Attorney, Agent, or Firm* — Chip Law Group

(57) ABSTRACT

The present technology relates to an image sensor and an electronic device capable of performing imaging in which mixed color is reduced. Photoelectric conversion layers including photoelectric conversion units separated in units of pixels are stacked in two or more layers, the image sensor is configured to include a state in which light incident on one pixel in a first photoelectric conversion layer closer to an optical lens is received by the photoelectric conversion unit in a second photoelectric conversion layer distant from the optical lens, the image sensor includes a light-shielding layer configured to shield light transmitted through the first photoelectric conversion layer, between the first photoelectric conversion layer and the second photoelectric conversion layer, the light-shielding layer has an opening to transmit the light from the first photoelectric conversion layer to the second photoelectric conversion layer, and the openings are made to be asymmetric with respect to the pixel in the first photoelectric conversion layer. The present technology (Continued)

can be applied to an image sensor with a multi-layered structure.

20 Claims, 24 Drawing Sheets

(51) Int. Cl.
    *H01L 27/146*     (2006.01)
    *H04N 5/369*     (2011.01)
    *G02F 1/1335*     (2006.01)
    *G02F 1/1362*     (2006.01)
    *H04N 5/238*     (2006.01)

(52) U.S. Cl.
    CPC .. *H01L 27/14603* (2013.01); *H01L 27/14623* (2013.01); *H01L 27/14634* (2013.01); *H01L 27/14643* (2013.01); *H04N 5/3696* (2013.01); *G02F 1/133512* (2013.01); *G02F 1/136209* (2013.01); *H04N 5/238* (2013.01)

(58) Field of Classification Search
    CPC ......... H01L 27/14643; G02F 1/136209; G02F 1/133512
    See application file for complete search history.

(56) References Cited

U.S. PATENT DOCUMENTS

| | | | | |
|---|---|---|---|---|
| 8,829,578 B2 * | 9/2014 | Maeda | ............... | H01L 27/14603 257/292 |
| 9,036,074 B2 * | 5/2015 | Murata | ................ | G02B 3/0056 348/294 |
| 9,703,015 B2 * | 7/2017 | Sekine | ................ | G02B 3/0037 |
| 9,882,154 B2 * | 1/2018 | Yamaguchi | ......... | H01L 51/4213 |
| 2005/0179103 A1 * | 8/2005 | Nakai | ............... | H01L 27/14627 257/436 |
| 2006/0157760 A1 * | 7/2006 | Hayashi | ................... | G03B 7/00 257/293 |
| 2013/0235237 A1 | 9/2013 | Aoki | | |
| 2013/0338439 A1 | 12/2013 | Kosugi et al. | | |
| 2014/0146207 A1 | 5/2014 | Yokogawa | | |
| 2015/0053846 A1 | 2/2015 | Byun | | |
| 2015/0054962 A1 | 2/2015 | Borthakur et al. | | |
| 2015/0124140 A1 * | 5/2015 | Ohkubo | ............ | H01L 27/14623 348/308 |
| 2015/0146056 A1 | 5/2015 | Hirota | | |
| 2015/0171146 A1 | 6/2015 | Ooki et al. | | |
| 2016/0133664 A1 * | 5/2016 | Aoki | ...................... | H04N 5/374 348/308 |
| 2018/0013972 A1 * | 1/2018 | Tashiro | ................... | G01S 17/10 |

FOREIGN PATENT DOCUMENTS

| | | | |
|---|---|---|---|
| CN | 103733340 A | | 4/2014 |
| CN | 104425532 A | | 3/2015 |
| CN | 104541372 A | | 4/2015 |
| CN | 104681572 A | | 6/2015 |
| EP | 2738810 A1 | | 6/2014 |
| EP | 2879181 A1 | | 6/2015 |
| JP | 2001053258 A | * | 2/2001 |
| JP | 2007273586 A | * | 10/2007 |
| JP | 2013-030626 A | | 2/2013 |
| JP | 2013-070030 A | | 4/2013 |
| JP | 2013157442 A | * | 8/2013 |
| JP | 2013-187475 A | | 9/2013 |
| JP | 2014-003461 A | | 1/2014 |
| JP | 2015-041780 A | | 3/2015 |
| JP | 2015-099875 A | | 5/2015 |
| JP | 2015-128131 A | | 7/2015 |
| KR | 10-1334219 B1 | | 11/2013 |
| KR | 10-2014-0053948 A | | 5/2014 |
| KR | 10-2015-0037810 A | | 4/2015 |
| RU | 2014101709 A | | 7/2015 |
| TW | 201308585 A | | 2/2013 |
| TW | 201411821 A | | 3/2014 |
| WO | 2013/015117 A1 | | 1/2013 |
| WO | 2014/017314 A1 | | 1/2014 |
| WO | 2015/076022 A1 | | 5/2015 |

* cited by examiner

IMAGE SENSOR AND ELECTRONIC DEVICE

CROSS REFERENCE TO RELATED APPLICATIONS

This application is a U.S. National Phase of International Patent Application No. PCT/JP2016/066570 filed on Jun. 3, 2016, which claims priority benefit of Japanese Patent Application No. JP2015-122530 filed in the Japan Patent Office on Jun. 18, 2015. Each of the above-referenced applications is hereby incorporated herein by reference in its entirety.

TECHNICAL FIELD

The present technology relates to an image sensor and an electronic device, and particularly, to an image sensor and an electronic device capable of achieving high quality in a captured image.

BACKGROUND ART

There is an image sensor using an organic photoelectric conversion film as a photoelectric conversion element (for example, see Patent Literature 1). Since the organic photoelectric conversion film can simultaneously perform color separation and light reception as a thin film, an aperture ratio is high and an on-chip lens is basically unnecessary.

There is also an image sensor in which a photodiode is also formed in a silicon layer below an organic photoelectric conversion film and phase difference detection is performed by the photodiode of the silicon layer while an image is acquired by the organic photoelectric conversion film (for example, see Patent Literature 2).

CITATION LIST

Patent Literature

Patent Literature 1: Japanese Patent No. 5244287
Patent Literature 2: JP 2011-103335A

DISCLOSURE OF INVENTION

Technical Problem

In the structure disclosed in Patent Literature 2, however, when a condensing point of an on-chip lens is set in the photodiode of the silicon layer, a radius of curvature of the on-chip lens decreases, and thus oblique incidence characteristics may deteriorate. Therefore, as an image height (a distance from an optical center) increases, an amount of received light decreases and sensitivity unevenness called shading occurs.

The present disclosure was finalized in view of this situation and is capable of achieving high quality in a captured image.

Solution to Problem

According to an aspect of the present technology, there is provided an image sensor in which photoelectric conversion layers including photoelectric conversion units separated in units of pixels are stacked in two or more layers, the image sensor is configured to include a state in which light incident on one pixel in a first photoelectric conversion layer closer to an optical lens is received by the photoelectric conversion unit in a second photoelectric conversion layer distant from the optical lens, the image sensor includes a light-shielding layer configured to shield light transmitted through the first photoelectric conversion layer, between the first photoelectric conversion layer and the second photoelectric conversion layer, the light-shielding layer has an opening to transmit the light from the first photoelectric conversion layer to the second photoelectric conversion layer, and the openings are made to be asymmetric with respect to the pixel in the first photoelectric conversion layer.

The openings may have different asymmetry in accordance with an image height of the optical lens.

Asymmetry of the openings may increase when an image height of the optical lens is raised.

Sides that form the opening may be disposed at positions shifted from sides that form a pixel in the first photoelectric conversion layer in which the opening is located. Among the sides that form the opening, a first side located on a central side of the optical lens and a second side different from the first side may be shifted by different shift amounts.

The shift may be performed in a horizontal direction.

The shift may be performed in a horizontal direction and a diagonal direction.

The shift may be performed in a vertical direction.

The shift may be performed in a vertical direction and a diagonal direction.

The shift may be performed in at least one of a horizontal direction, a vertical direction, and a diagonal direction.

A pixel of the photoelectric conversion unit in the second photoelectric conversion layer may be a phase difference detection pixel.

The image sensor may further include: a light-shielding unit configured to shield light transmitted through the opening, between the light-shielding layer and the second photoelectric conversion layer. The pixel of the photoelectric conversion unit in the second photoelectric conversion layer may be configured in a state in which the light is half shielded by the light-shielding unit. The pixel of the photoelectric conversion unit in the second photoelectric conversion layer may be set as a phase difference detection pixel.

The image sensor may further include a light-shielding unit formed between the first photoelectric conversion layer and the second photoelectric conversion layer in a grid state in which the light transmitted through the first photoelectric conversion layer is shielded.

Grids of the light-shielding units disposed to be adjacent to each other may be grids in different directions.

The image sensor may further include a narrow-band filter between the first photoelectric conversion layer and the second photoelectric conversion layer. The light transmitted through the first photoelectric conversion layer may arrive at the photoelectric conversion unit of the second photoelectric conversion layer via the filter.

The image sensor may further include: a plasmon filter between the first photoelectric conversion layer and the second photoelectric conversion layer. The light transmitted through the first photoelectric conversion layer arrives at the photoelectric conversion unit of the second photoelectric conversion layer via the plasmon filter.

The image sensor may further include a Fabry-Pérot interferometer between the first photoelectric conversion layer and the second photoelectric conversion layer. The light transmitted through the first photoelectric conversion layer arrives at the photoelectric conversion unit of the second photoelectric conversion layer via the Fabry-Pérot interferometer.

The photoelectric conversion unit in the second photoelectric conversion layer may form a time of flight (TOF) type sensor.

The photoelectric conversion unit in the second photoelectric conversion layer may form a light field camera.

The photoelectric conversion unit in the second photoelectric conversion layer may be used as a sensor that images a subject and acquires an image.

According to an aspect of the present technology, an electronic device includes an image sensor, in which photoelectric conversion layers including photoelectric conversion units separated in units of pixels are stacked in two or more layers, the image sensor is configured to include a state in which light incident on one pixel in a first photoelectric conversion layer closer to an optical lens is received by the photoelectric conversion unit in a second photoelectric conversion layer distant from the optical lens, the image sensor includes a light-shielding layer configured to shield light transmitted through the first photoelectric conversion layer, between the first photoelectric conversion layer and the second photoelectric conversion layer, the light-shielding layer has an opening to transmit the light from the first photoelectric conversion layer to the second photoelectric conversion layer, and the openings are made to be asymmetric with respect to the pixel in the first photoelectric conversion layer.

In an image sensor according to an aspect of the present technology, photoelectric conversion layers including photoelectric conversion units separated in units of pixels are stacked in two or more layers, the image sensor is configured to include a state in which light incident on one pixel in a first photoelectric conversion layer closer to an optical lens is received by the photoelectric conversion unit in a second photoelectric conversion layer distant from the optical lens, the image sensor includes a light-shielding layer configured to shield light transmitted through the first photoelectric conversion layer, between the first photoelectric conversion layer and the second photoelectric conversion layer, the light-shielding layer has an opening to transmit the light from the first photoelectric conversion layer to the second photoelectric conversion layer, and the openings are made to be asymmetric with respect to the pixel in the first photoelectric conversion layer.

According to an aspect of the present technology, an electronic device includes the image sensor.

Advantageous Effects of Invention

According to an aspect of the present technology, it is possible to achieve high quality in a captured image.

In addition, the advantageous effect described here is not necessarily limiting, and any advantageous effect described in the present disclosure may be included.

MODE(S) FOR CARRYING OUT THE INVENTION

Figure 1:
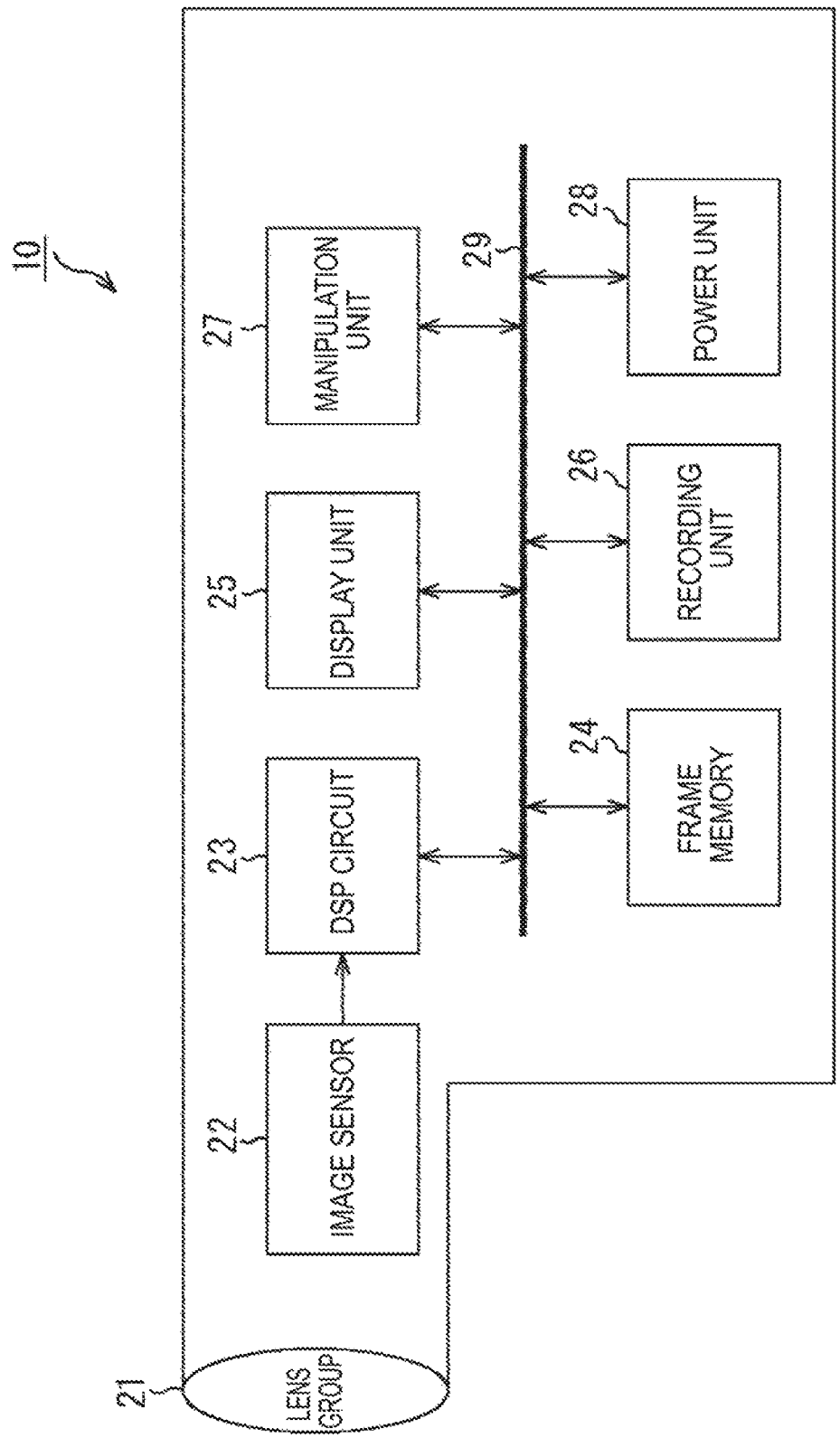
FIG. 1 is a diagram illustrating an imaging mechanism including an image sensor according to the present disclosure.

Hereinafter, modes for carrying out the present technology (hereinafter referred to as embodiments) will be described. In addition, the description will be made in the following order.
1. Configuration of imaging device
2. Configuration of imaging mechanism
3. Mixed color in accordance with size of opening
4. Configuration of image sensor to which present technology is applied
5. Embodiment in which pixel in second layer is set as phase difference detection pixel
6. Configuration in which light-shielding film in grid state is included
7. Configuration in which narrow-band filter is included
8. Configuration in which plasmon filter is included
9. Configuration in which Fabry-Pérot interferometer is included
10. Configuration in which TOF type sensor is included
11. Configuration in which LFC type sensor is included
12. Configuration in which image is captured in two layers
13. Other configurations
14. Use example of image sensor <Configuration of Imaging Device>

The present technology to be described below can be applied to all electronic devices in which semiconductor packages are used in image acquisition units (photoelectric conversion units), for example, imaging devices such as digital still cameras or video cameras, portable terminal devices such as mobile phones with an imaging function, and copying machines in which imaging devices are used in image reading units.

FIG. 1 is a block diagram illustrating an example of a configuration of an electronic device according to the present technology, for example, an imaging device. As illustrated in FIG. 1, an imaging device 10 according to the present technology includes an optical system including a lens group 21, an image sensor (imaging device) 22, a digital signal processor (DSP) circuit 23, a frame memory 24, a display unit 25, a recording unit 26, a manipulation unit 27, and a power unit 28. The DSP circuit 23, the frame memory 24, the display unit 25, the recording unit 26, the manipulation unit 27, and the power unit 28 are connected to each other via a bus line 29.

The lens group 21 acquires incident light (image light) from a subject and forms an image on an imaging surface of the image sensor 22. The image sensor 22 converts an amount of incident light formed as the image on the imaging surface by the lens group 21 into an electric signal in units of pixels and outputs the electric signal as a pixel signal.

The DSP circuit 23 processes the signal from the image sensor 22. For example, as will be described in detail, the image sensor 22 has pixels for detecting focus, processes signals from the pixels, and performs a process of detecting the focus. Also, the image sensor 22 has pixels for constructing an image of a captured subject, processes signals from the pixels, and performs a process of loading the processed signals to the frame memory 24.

The display unit 25 is configured as a panel display device such as a liquid crystal display device or an organic electro luminescence (EL) display device and displays a moving image or a still image captured by the image sensor 22. The recording unit 26 records a moving image or a still image captured by the image sensor 22 on a recording medium such as a video tape or a digital versatile disk (DVD).

The manipulation unit 27 issues manipulation instructions in regard to various functions of the imaging device through an operation by a user. The power unit 28 appropriately supplies various kinds of power serving as operation power of the DSP circuit 23, the frame memory 24, the display unit 25, the recording unit 26, and the manipulation unit 27 to supply targets.

<Configuration of Imaging Mechanism>

Figure 2:
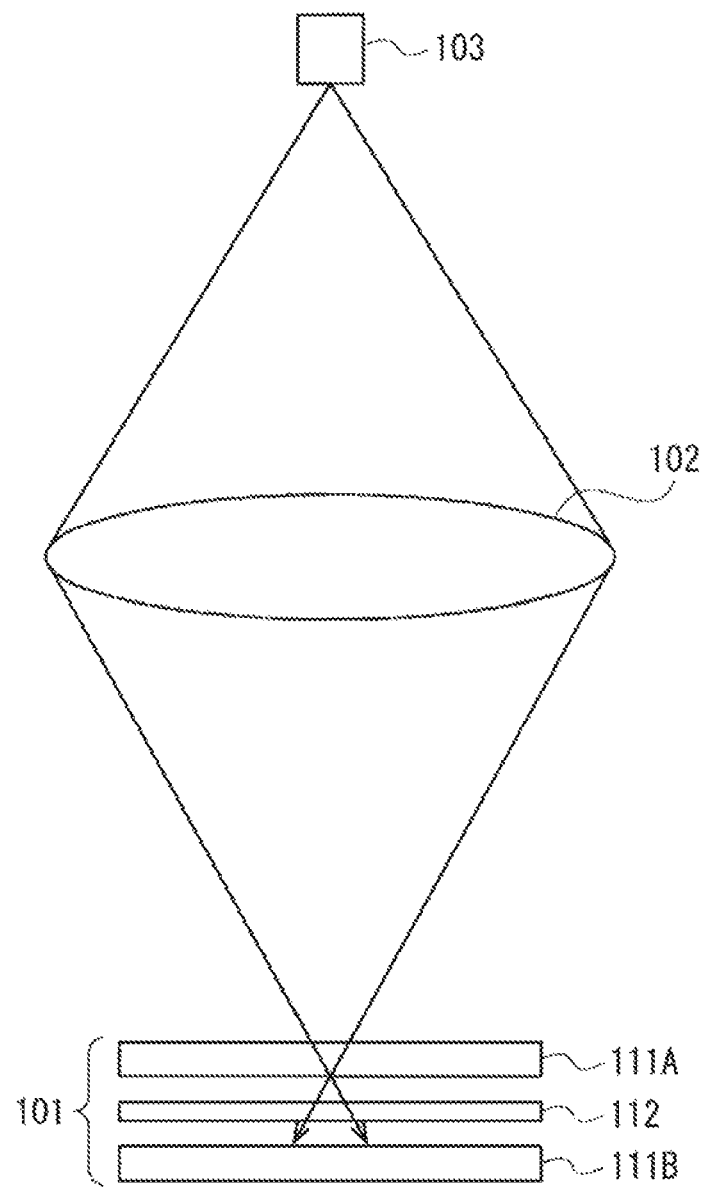
FIG. 2 is an explanatory diagram illustrating a configuration of an image sensor to which the present technology is applied.

FIG. 2 is a diagram illustrating an imaging mechanism including the image sensor according to the present disclosure.

An image sensor 101 according to the present disclosure receives light of a subject 3 condensed by an optical lens 102, as illustrated in FIG. 2. The image sensor 101 is equivalent to the image sensor 22 in FIG. 1. The optical lens 102 is equivalent to the optical lens group 21 of the imaging device 10 in FIG. 1.

The image sensor 101 is, for example, a compound image sensor in which two semiconductor substrates 111A and 111B are stacked. In each of the semiconductor substrates 111A and 111B, a photoelectric conversion unit and a photoelectric conversion layer including a charge detection unit that thus detects photoelectrically converted charges are formed. Semiconductors of the semiconductor substrates 111A and 111B are, for example, silicon (Si). An aperture 112 is formed between the two semiconductor substrates 111A and 111B.

In addition, hereinafter, of the two semiconductor substrates 111A and 111B, the semiconductor substrate 111A closer to the optical lens 102 is referred to as an upper substrate 111A and the semiconductor substrate 111B further from the optical lens 102 is referred to as a lower substrate 111B. Also, in a case in which the two semiconductor substrates 111A and 111B are not particularly distinguished from each other, the two semiconductor substrates 111A and 111B are also referred to as the substrates 111.

Figure 3:
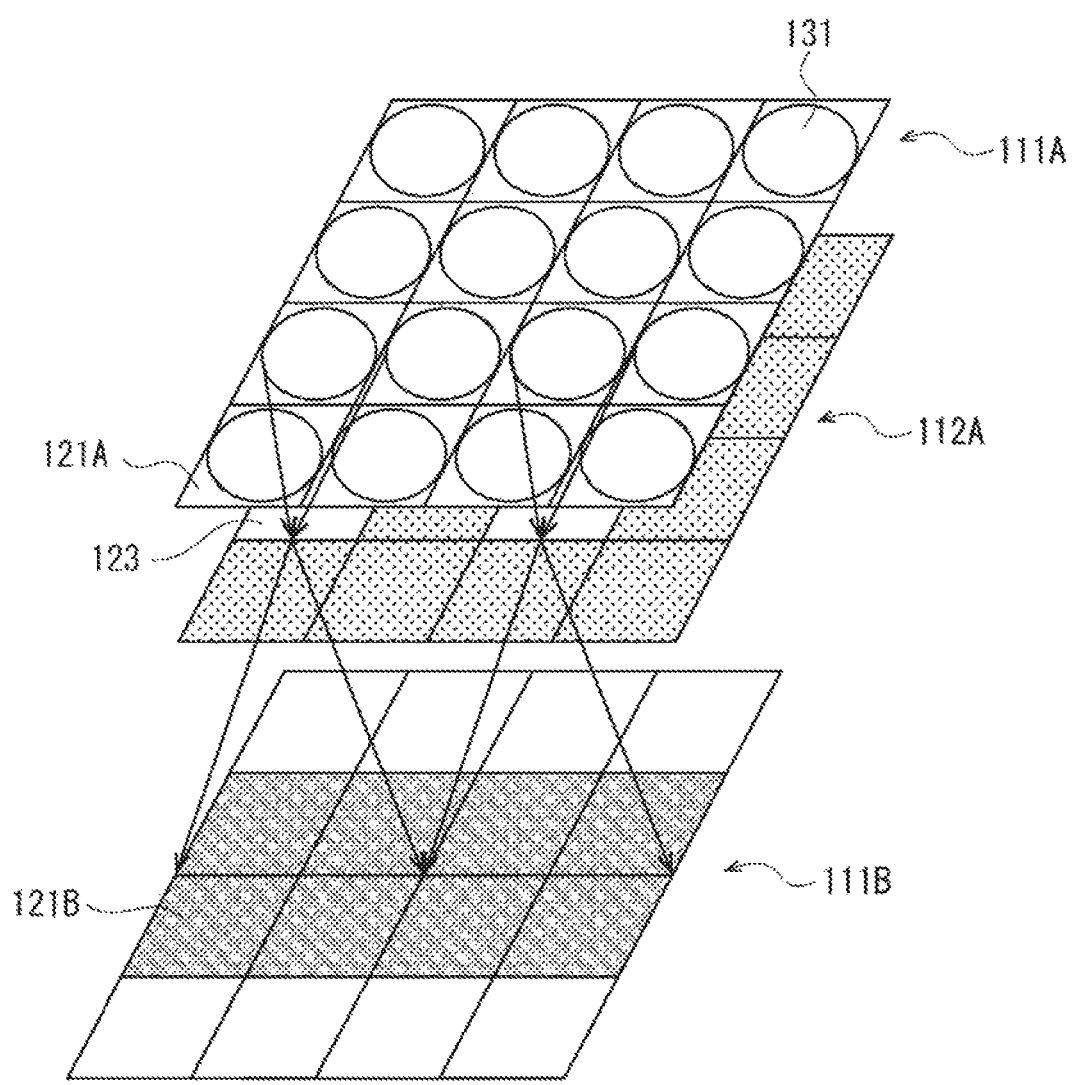
FIG. 3 is an explanatory diagram illustrating a configuration of an image sensor to which the present technology is applied.

FIG. 3 is a diagram illustrating a schematic configuration of the image sensor 101.

In the upper substrate 111A, a plurality of pixels 121A are arranged in a 2-dimensional array form. An on-chip lens 131 is formed in each pixel 121A. Pixel signals acquired by the plurality of pixels 121A arranged in the upper substrate 111A are used as image generation signals. Accordingly, the upper substrate 11A functions as a pixel sensor.

In the lower substrate 111B, a plurality of pixels 121B are also arranged in a 2-dimensional array form. Pixel signals acquired by the plurality of pixels 121B arranged in the lower substrate 111B can be used as, for example, phase difference detection signals, as will be described. In this case, the lower substrate 111B functions as a phase difference detection sensor.

In the aperture 112, as illustrated in FIG. 3, openings 123 are formed at a predetermined interval. Thus, as the pixels 121A of the upper substrate 111A, there are pixels which transmit incident light through the lower substrate 111B and pixels which do not transmit incident light through the lower substrate 111B.

For example, as illustrated in FIG. 2, incident light passing through one pixel (hereinafter referred to as a transmission pixel) of the upper substrate 111A corresponding to the opening 121 of the aperture 112 is incident on four pixels of 2×2 of the lower substrate 111B.

In addition, FIGS. 2 and 3 are explanatory diagrams illustrating a relation between the transmission pixels of the upper substrate 111A and light-receiving pixels of the lower substrate 111B receiving incident light from the transmission pixels of the upper substrate 111A. Scales of pixel sizes of the upper substrate 111A and the lower substrate 11B are different.

In this way, in the image sensor 101 to which the present technology is applied, the pixels can be disposed in two layers and can be used as the pixels that have separate functions, for example, in such a manner that the pixels disposed in the upper layer are set as pixels performing normal imaging and the pixels disposed in the lower layer are set as phase difference detection pixels.

In an image surface phase difference sensor in which phase difference pixels are arranged in a part of an image sensor with a single-layered structure rather than a stacked structure, a condensing point of the on-chip lens is ideally a photodiode surface of a silicon layer, but is actually a deep position of the silicon layer. Therefore, an imaging condensing point is different from a phase difference detection condensing point and there is a problem that optimization of microlenses is incompatible.

Also, when a condensing point of an on-chip lens is set on the surface of a photodiode of the silicon layer, a radius of curvature of the on-chip lens decreases, and thus oblique incidence characteristics may deteriorate. Therefore, as an image height (a distance from an optical center) increases, an amount of received light decreases and shading occurs.

Accordingly, in the image sensor 101, by stacking the two substrates 111 and disposing the phase difference detection pixels in the lower substrate 111B, as will be described below, it is possible to increase the radius of curvature of the on-chip lens, and thus it is possible to suppress occurrence of shading.

Also, as will be described, incident light passing through one pixel of the upper substrate 111A can also be received by a plurality of pixels greater than 2×2. Therefore, multi-viewpoint separation is performed, separation performance of the phase difference pixels is improved, and thus high performance of phase difference autofocus is possible.

Figure 4:
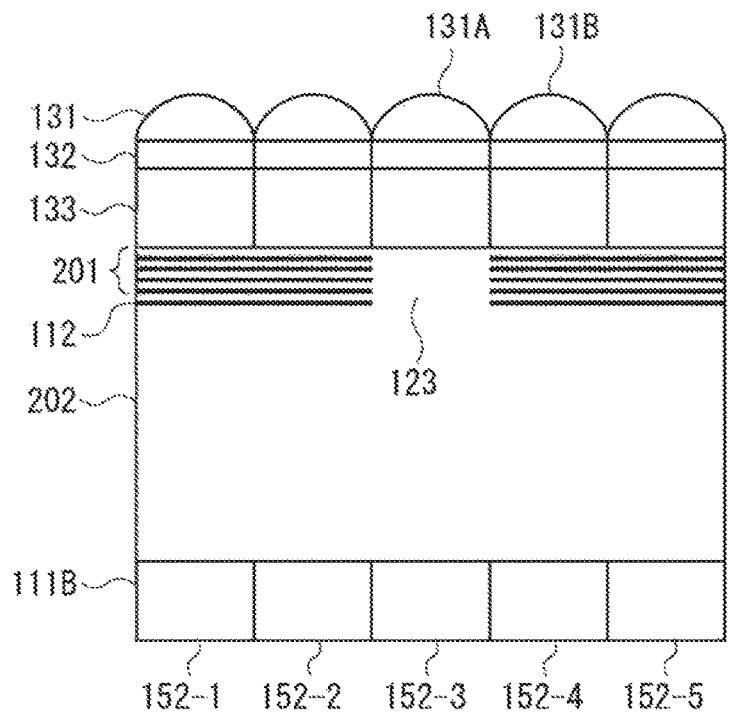
FIG. 4 is a diagram illustrating a configuration of an image sensor according to the related art.

FIG. 4 is a sectional view illustrating the image sensor 101. The upper substrate 111A is located above the image sensor 101, and the on-chip lenses 131, on-chip color filters 132, and photodiodes 133 are disposed. The on-chip lens 131, the on-chip color filter 132, and the photodiode 133 form the pixel 121A (see FIG. 2).

Here, the photodiode 133 disposed in the upper substrate 111A has been described, but a photoelectric conversion layer in which the photodiode 133 is disposed may be configured as an organic photoelectric conversion film or the like. Also, in a case in which the photoelectric conversion layer is configured as the organic photoelectric conversion film, a plurality of photoelectric conversion layers may be configured. Also, the upper substrate 111A formed as a backside irradiation substrate has been described as an example, but the present technology can be applied to either a backside irradiation substrate or a frontside irradiation substrate.

A multilayer wiring layer 201 that includes a plurality of wiring layers and inter-layer insulation films is formed below the photodiodes 133 of the upper substrate 111A. The multilayer wiring layer 201 can also be configured such that a plurality of transistor circuits included in a reading circuit that reads signal charges accumulated in the photodiodes 133 are formed near the upper substrate 111A.

The aperture 112 is disposed below the upper substrate 111A.

The lower substrate 111B is configured by, for example, a silicon layer which is an n type (first conductive type) semiconductor region and a photodiode serving as a photoelectric conversion unit can be configured for each pixel by pn junction in the silicon layer. The size of the pixel in the lower substrate 111B may be different from the size of the pixel in the upper substrate 111A.

A multilayer wiring layer including a plurality of transistor circuits included in a reading circuit that reads signal charges accumulated in the photodiodes, a plurality of wiring layers, and inter-layer insulation films may be formed above or below the lower substrate 111B. In an embodiment illustrated in FIG. 4, the upper substrate 111A and the lower substrate 111B are joined (adhered) via an inter-layer insulation film 202.

Pixels 152-1 to 152-5 are disposed in the lower substrate 111B. The pixels 152 are equivalent to the pixels 121B in FIG. 2. Here, the pixels 152-1 to 152-5 are assumed to be photodiodes and are also appropriately described as the photodiodes 152.

Also, the pixels 152-1 to 152-5 are appropriately described as a pixel group 151. The pixel group 151 is not limited to a case in which five pixels are included, but a plurality of pixels may be included.

The pixels 152-11 to 152-5 receive light transmitted through one on-chip lens 131.

The wiring layers of the multilayer wiring layer 201 include wirings formed of copper or the like. The multilayer wiring layer 201 can also be configured to also function as a light-shielding film along with the aperture 112. As illustrated in FIG. 4, in a case in which the on-chip lens 131 illustrated in the middle of the drawing is assumed to be an on-chip lens 131A, light transmitted through the on-chip lens 131A is configured to be received by one of the pixels 152-1 to 152-5 via an opening 123 of the aperture 112.

On the other hand, light from the on-chip lens 131 different from the on-chip lens 131A, for example, the on-chip lens 131B near to the right of the on-chip lens 131A, is configured not to be received by the pixels 152-1 to 152-5 without being transmitted through the aperture 112.

In this way, light shielding of the aperture 112 is configured so that light transmitted through one on-chip lens 131 can be received by the pixel group 151 of the lower substrate 111B.

<Mixed Color in Accordance with Size of Opening>

For example, the opening 123 of the aperture 112 can be configured to have the same size as the size of one pixel which is the size of the pixel 121A of the upper substrate 111A, as illustrated in FIG. 3. In other words, the opening can be formed with the same size as the transmission pixel and at a position immediately below the transmission pixel. FIG. 4 illustrates a configuration in which the opening has the same size as the pixel 121A. In this way, in a case in which the opening 123 has the same size as the pixel 121A and is located at the same position, reflection or diffraction occurs and there is a possibility of condensing efficiency deteriorating.

Figure 5:
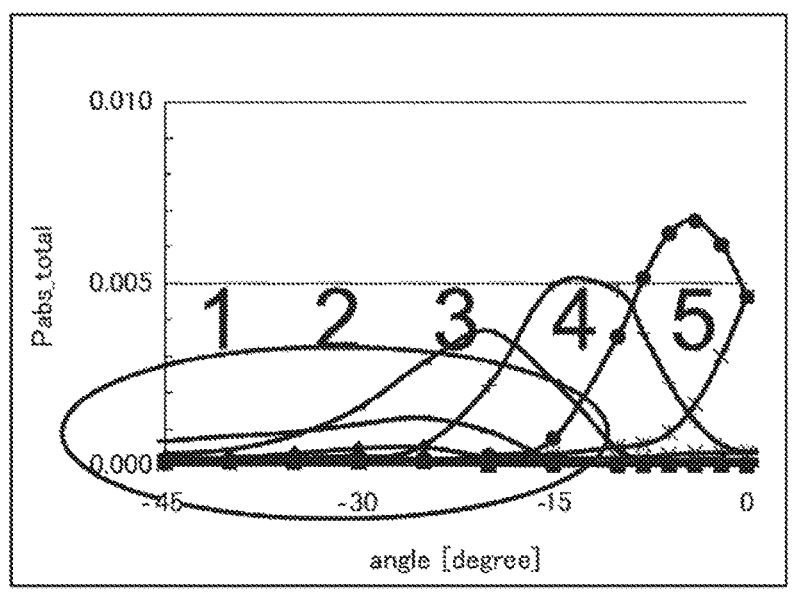
FIG. 5 is an explanatory diagram illustrating mixed color occurring depending on the size of an opening.

This problem will be described with reference to FIG. 5. FIG. 5 is a graph illustrating a relation between an angle of incidence of light in the image sensor 101 that has the configuration illustrated in FIG. 4 and an amount of light received in the pixel 152. In the graph illustrated in FIG. 5, the horizontal axis represents an angle of incidence of a ray and the vertical axis represents sensitivity characteristics (Pabs total). Numerals in the drawing are numerals indicating the pixels 152-1 to 152-5 (see FIG. 4). For example, "1" indicates the pixel 152-1.

In the graph illustrating phase difference characteristics illustrated in FIG. 5, it can be read that a pixel obtaining a peak value is different in accordance with an angle of incidence of a ray. For example, in a case in which the angle of incidence of the ray is 0 degrees, the pixel 152-5 has a highest peak value. In a case in which the angel of incidence of the ray is −15 degrees, the pixel 152-4 has a highest peak value.

Also, from FIG. 5, it can be read that the amount of light received by the pixels 152-1 to 152-5 is small. In particular, it can be read that light with a high angle of incidence, for example, an angle of incidence equal to or less than −30 degrees in FIG. 5, is rarely received. The pixels 152-1 and 152-2 are in a state in which a graph with peaks is not obtainable.

In a case in which the aperture 112 is configured to have the same size as the pixel 121A and to be located at the same position, mixed color from adjacent pixels is reduced, but necessary light becomes vignetting. Thus, the amount of received light may be reduced.

Figure 6:
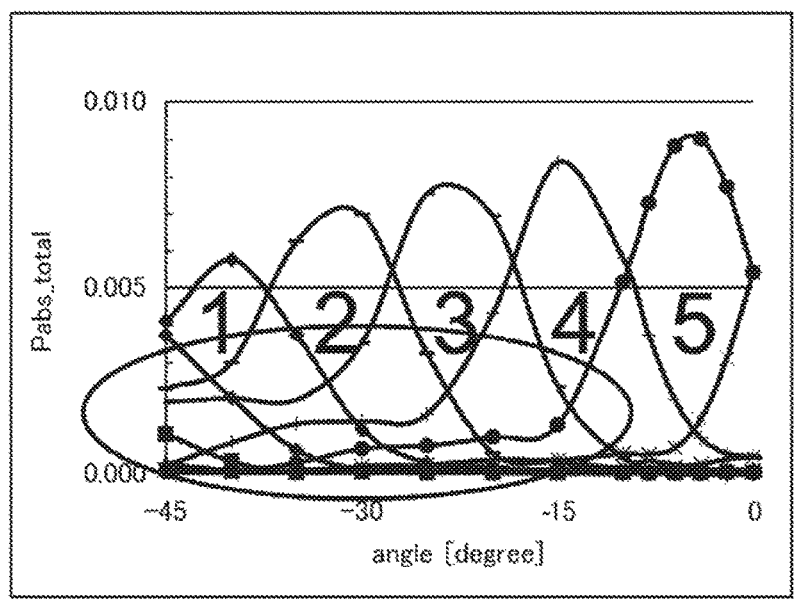
FIG. 6 is an explanatory diagram illustrating mixed color occurring depending on the size of an opening.

Accordingly, a case in which the opening 123 of the aperture 112 is wide will be considered. FIG. 6 is a graph illustrating a relation between the amount of light received by the pixels 152 and an angle of incidence of light in the image sensor 101 that has the configuration illustrated in FIG. 4 in a case in which the opening 123 of the aperture 112 is wide (not illustrated).

As in the graph illustrated in FIG. 5, in the graph illustrated in FIG. 6, the horizontal axis represents an angle of incidence of a ray and the vertical axis represents sensitivity characteristics. Numerals in the drawing are numerals indicating the pixels 152-1 to 152-5 (see FIG. 4).

When the graph illustrated in FIG. 5 is compared to the graph illustrated in FIG. 6, it can be read that sensitivity is raised on the whole in the graph illustrated in FIG. 6. Also, for example, referring to the graph (the graph illustrating sensitivity of the pixel 152-3) that has a peak in a range of the angle of incidence from −25 to −20 degrees, it can be read that a level is raised at a high angle of incidence and light at the high angle of incidence is also received.

In the configuration in which the opening 123 of the aperture 112 is wide, it is possible that necessary light does not become vignetting. However, mixed color from adjacent pixels may be larger.

Figure 7:
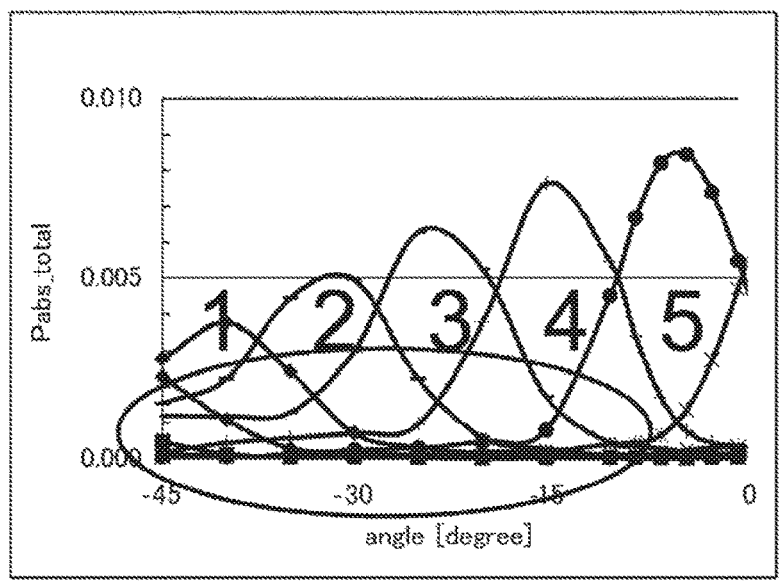
FIG. 7 is an explanatory diagram illustrating mixed color occurring depending on the size of an opening.

Ideally, the opening 123 in which a graph illustrated in FIG. 7 is obtained is preferable. As in the graph illustrated in FIGS. 5 and 6, in the graph illustrated in FIG. 7, the horizontal axis represents an angle of incidence of a ray and the vertical axis represents sensitivity characteristics. Numerals in the drawing are numerals indicating the pixels 152-1 to 152-5 (see FIG. 4).

Referring to the graph illustrated in FIG. 7, a peak can be obtained in any of the pixels 152-1 to 152-5. From this point, it can be read that since any of the pixels 152 includes a high angle of incidence and light can be received with high sensitivity, the light reception of the high sensitivity can be realized even in the pixel group 151.

Also, referring to the graph (the graph illustrating the sensitivity of the pixel 152-3) that has a peak in a range of an angle of incidence from −25 to −20 degrees, it can be read that a level is lowered in a range out of the range of the angle of incidence from −25 to −20 degrees and an influence of the mixed color from the adjacent pixels is suppressed.

The image sensor 101 in which such a graph is obtained will be described below.

<Configuration of Image Sensor to which Present Technology is Applied>

Figure 8:
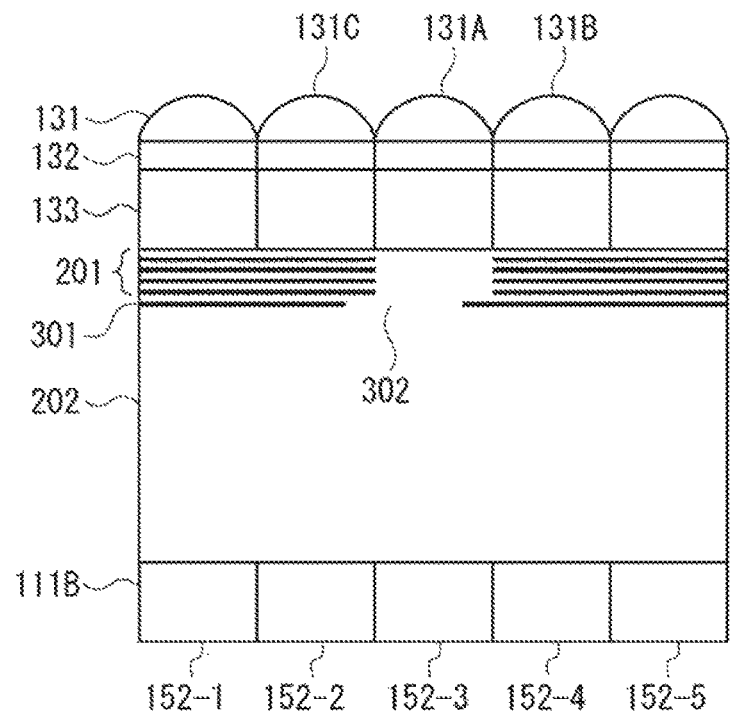
FIG. 8 is an explanatory diagram illustrating a configuration of the image sensor.

FIG. 8 is a diagram illustrating an embodiment of the configuration of the image sensor 101 to which the present technology is applied. The image sensor 101 illustrated in FIG. 8 and the image sensor 101 illustrated in FIG. 4 basically have the same configuration, but the position, the size, the shape, or the like of the opening 123 of the aperture 112 differs. Here, to indicate a difference from the aperture 112 of the image sensor 101 illustrated in FIG. 4, an aperture 301 is described and the opening 123 is also described as an opening 302.

The opening 302 of the aperture 301 illustrated in FIG. 8 is formed at a position spanning two pixels. That is, this configuration is different from the above-described configuration in which the opening 302 is installed immediately below the transmission pixel. The aperture 301 is formed of a material such as metal through which light is not transmitted and functions as a light-shielding layer that shields light transmitted through the upper substrate 111A. Accordingly, of the light transmitted through the upper substrate 111A, light other than the light transmitted through the opening 302 is shielded by the aperture 112 and does not arrive at the lower substrate 111B.

In addition, a portion of the opening 302 of the aperture 301 is also opened in the multilayer wiring layer 201. Accordingly, the following description is also applied to an opening of the multilayer wiring layer 201. Also, the description will continue assuming the aperture 301 and the multilayer wiring layer 201 are separated and the aperture 301 is exemplified. A configuration in which the multilayer wiring layer 201 has the function (the light-shielding function) of the aperture 301 and the aperture 301 is omitted can also be realized. Alternatively, the aperture 301 can also be formed of a material with conductivity and function as the multilayer wiring layer 201.

That is, a light-shielding layer installed between the upper substrate 111A and the lower substrate 111B may be configured as the aperture 301, may be configured as the aperture 301 and the multiplayer wiring layer 201, or may be configured as the multiplayer wiring layer 201.

The opening 302 is installed from the vicinity of the middle of the on-chip lens 131A to the vicinity of the middle of the adjacent on-chip 131C. In this way, the opening 302 is not installed below one pixel (the photodiode 133) installed in the upper substrate 111A, but is installed across a plurality of pixels.

The size of the opening 302 will be further described with reference to FIG. 9. The on-chip lens 131A and the on-chip lens 131C are illustrated and each central axis is illustrated with a dotted line. The diameter of one on-chip lens 131, in other words, the width size of one pixel, is assumed to be a size a.

Figure 9:
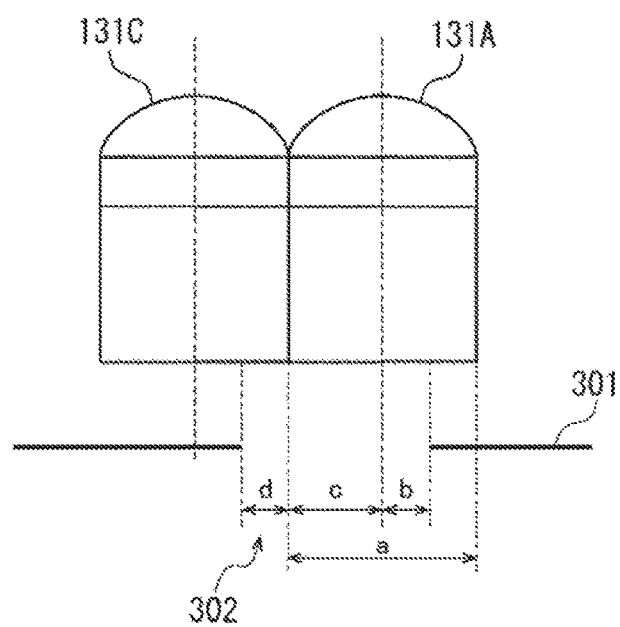
FIG. 9 is an explanatory diagram illustrating left-right asymmetry of the opening.

As illustrated in FIG. 9, the opening 302 of the aperture 301 starts from a location moved by a size b to the right from the central axis of the on-chip lens 131A. Also, the opening 302 ends at a location moved by a size d to the left from end of the on-chip lens 131A. The opening 302 includes the size b. The size b is equivalent to a half of the size a (the radius of the on-chip lens 131A).

In this case, the size of the opening 302 is a size (b+c+d). The size (b+c+d) may be the same as the size a or may be less or greater than the size a.

When the on-chip lens 131A is focused, in other words, when the transmission pixel in which the opening 302 is installed is focused, the opening 302 is not installed with the same size centering on the central axis, but is installed to be left-right asymmetric. In the example illustrated in FIG. 9, a size of the opening 302 installed to the right of the central axis of the on-chip lens 131A is the size b and a size of the opening 302 installed to the left of the central axis of the on-chip lens 131A is a size (c+d). The size b is not the same as, but is different from the size (c+d).

In this way, when the opening 302 is viewed from the on-chip lens 131A (the transmission pixel), the left and right sizes are different and the opening 302 is installed to be left-right asymmetric.

Referring back to FIG. 4, the opening 123 of the aperture 112 illustrated in FIG. 4 is installed immediately below the on-chip lens 131A, has the same sizes centering on the central axis, and is installed to be left-right symmetric. In this way, when the opening 123 is installed to be left-right symmetric centering on the central axis of the on-chip lens 131A, there is a possibility of vignetting or mixed color occurring, as described with reference to FIGS. 5 and 6.

However, as described with reference to FIGS. 8 and 9, by installing an opening that has different sizes centering on the central axis of the on-chip lens 131A and is left-right asymmetric as in the opening 302 of the aperture 301, it is possible to prevent mixed color from adjacent pixels without generating vignetting of necessary light. Thus, it is possible to realize the image sensor 101 in which the graph illustrated in FIG. 7 can be obtained.

Figure 10:
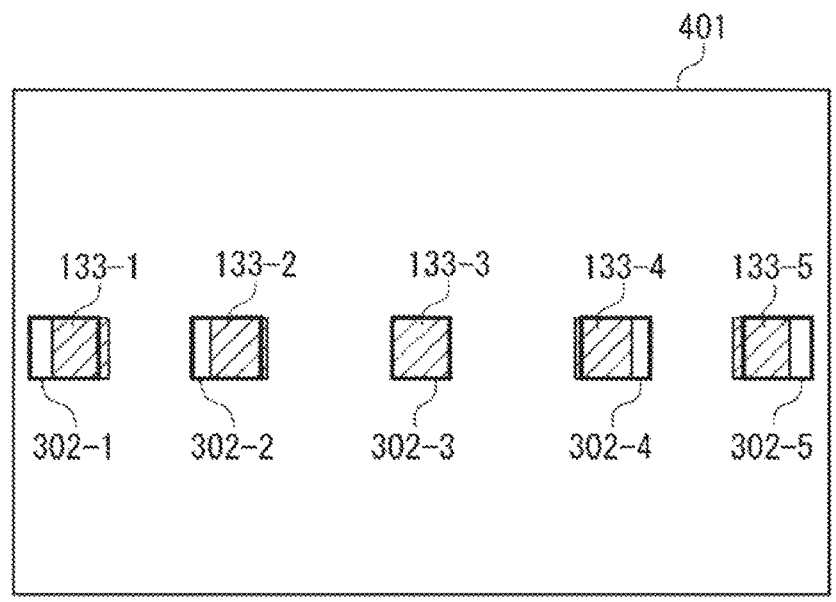
FIG. 10 is an explanatory diagram illustrating shift of the opening.

When the opening 302 is viewed from the upper side of the image sensor 101, the opening 302 is installed to have a shape and a size at a position, as illustrated in FIG. 10. FIG. 10 is a diagram illustrating a screen image and a pixel (the photodiode 133 in FIG. 10) disposed in the upper substrate 111A in a first layer of the screen image in which the opening 302 is installed.

A screen image 401 illustrated in FIG. 10 indicates a part of an image captured by the imaging apparatus 10 (see FIG. 1). Five openings 302-1 to 302-5 are disposed in the screen image in the screen image 401. Photodiodes 133-1 to 133-5 in which the openings 302-1 to 302-5 are disposed are illustrated. In FIG. 10, the opening 302 is indicated with a quadrangular frame and the photodiode 133 (pixel) is indicated with a quadrangle (square) with oblique lines.

In addition, in FIG. 10 in the following description, five pixels will be described as an example. The openings 302 can be installed from several pixels to all the pixels, the number of openings and disposition positions of the openings can be changed in accordance with uses or precision, and shift amounts to be described below can also be changed.

The opening 302-3 disposed at the position of the photodiode 133-3 disposed in the middle of the screen image 401 is opened with a size which is substantially left-right target. The opening 302-2 disposed at the position of the photodiode 133-2 disposed in the neighborhood to the left of the photodiode 133-3 is opened with a size which is left-right asymmetric and is opened at a position shifted to the left of the photodiode 133-3.

The opening 302-1 disposed at the position of the photodiode 133-1 disposed in the neighborhood to the left of the photodiode 133-2 is opened with a size which is left-right asymmetric and is opened at a position shifted to the left of the photodiode 133-1. Also, a shift amount in the opening 302-1 is larger than in the opening 302-2.

Similarly, the opening 302-4 disposed at the position of the photodiode 133-4 disposed in the neighborhood to the right of the photodiode 133-3 is opened with a size which is left-right asymmetric and is opened at a position shifted to the right of the photodiode 133-4.

The opening 302-5 disposed at the position of the photodiode 133-5 disposed in the neighborhood to the right of the photodiode 133-4 is opened with a size which is left-right asymmetric and is opened at a position shifted to the right of the photodiode 133-5. Also, a shift amount in the opening 302-5 is larger than in the opening 302-4.

In this way, the position of the opening 302 with respect to the photodiode 133 differs in accordance with the position of the opening 302. In the example illustrated in FIG. 10, the opening is configured so that a shift amount from the central axis of the photodiode 133 is larger as the opening is oriented from the middle of the screen image 401 to the ends of the screen image 401. In other words, the positions of the openings 302 are set in accordance with an image height of the optical lens 102 (see FIG. 2).

That is, in the example illustrated in FIG. 10, a shift amount is larger as the image height is raised from the vicinity of proportion 0 (an end of the screen image 401) of the image height (the middle of the screen image 401). In other words, as the image height is raised, the asymmetry of the openings 302 increases.

Also, as the image height is raised, an opening area of the opening 302 may increase. In a case in which the opening area is enlarged in accordance with the image height, for example, the opening area (shift amount) can be set on the basis of a graph illustrated in FIG. 11 or 12. In the graphs illustrated in FIGS. 11 and 12, the horizontal axis represents an image height and the vertical axis represents a diaphragm shift amount. In the graphs, thick lines represent a shift amount of a central side and thin lines represent a shift amount of a peripheral side.

The central side means a side on which the image height is oriented to proportion 0 (the center of the image height). For example, sides on the central side of the opening 302 are a side located to the right of the opening 302-2 and a side located to the left of the opening 302-4 in FIG. 10.

The peripheral side is an opposite side to the central side and means a side on which the image height is oriented to the side of proportion 10. For example, sides of the peripheral side of the opening 302 are a side located to the left of the opening 302-2 and a side located to the right of the opening 302-4 in FIG. 10.

Figure 11:
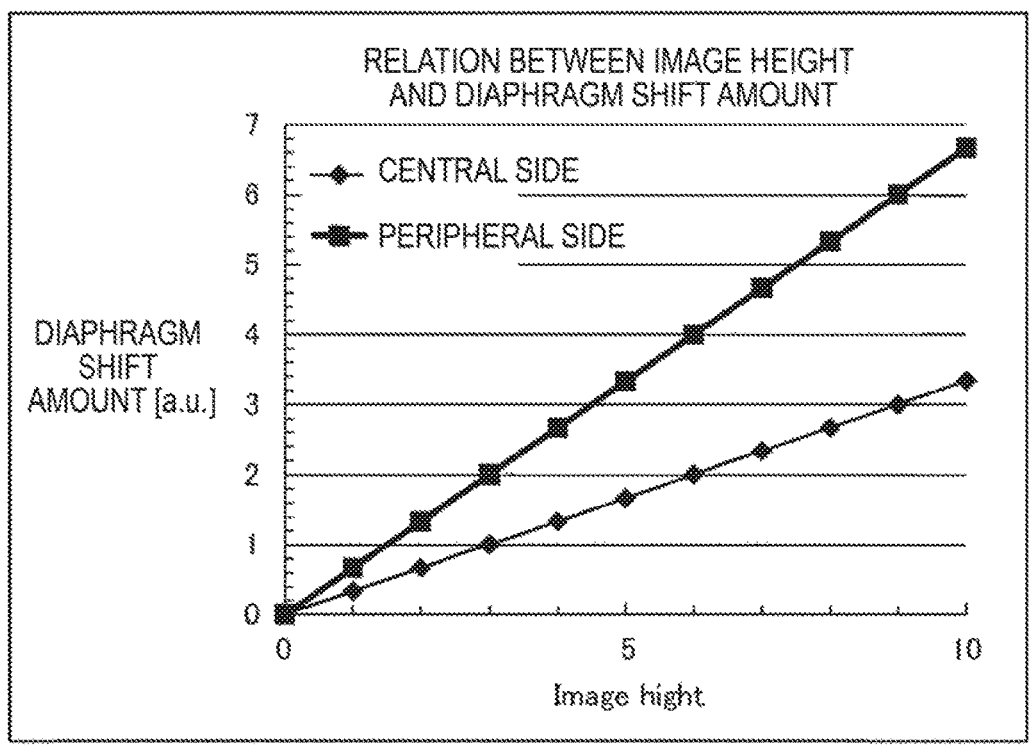
FIG. 11 is an explanatory diagram illustrating an image height and a shift amount.

Referring to FIG. 11, a shift amount of the image height of proportion 0 is 0 in both the central side and the peripheral side. A pixel of the image height of 0 proportion 0 is the photodiode 133-3 (see FIG. 10) and a shift amount of the opening 302-3 at the location of the photodiode 133 is considered to be 0. Accordingly, as illustrated in FIG. 10, the photodiode 133-3 and the opening 302-3 are installed in a nearly overlapped state and are not left-right symmetric.

Also, a shift amount of the image height of proportion 9 is about 3 (a.u.) on the central side and is about 6 (a.u.) on the peripheral side. In a case in which a pixel of the image height of proportion 9 is the photodiode 133-5 (see FIG. 10), a shift amount of the side of the central side of the opening 302-3 at the location of the photodiode 133-5 is considered to be about 3 and a shift amount of the peripheral side is considered to be about 6.

A shift amount of the central side is an amount by which the side of the central side is shifted to the left or right of the photodiode 133 and is set in accordance with the image height. In this case, the side (left side) of the central side of the opening 302-5 is installed at a position shifted to the right by about 3 (a.u.) from the left side of the photodiode 133-5.

Similarly, a shift amount of the peripheral side is an amount by which the side of the peripheral side is shifted to the left or the right of the photodiode 133 and is set in accordance with the image height. In this case, the side (left side) of the peripheral side of the opening 302-5 is installed at a position shifted to the right by about 6 (a.u.) from the right side of the photodiode 133-5.

The opening 302 installed in regard to the photodiode 133 located to the left of the photodiode 133 located in the middle is shifted by a shift amount in accordance with the image height to the left of the left side (the peripheral side) or the right side (the central side) of the photodiode 133.

The shift amounts on the central side and the peripheral side differ. Therefore, the opening area of the opening 302 increases as the image height is raised.

Figure 12:
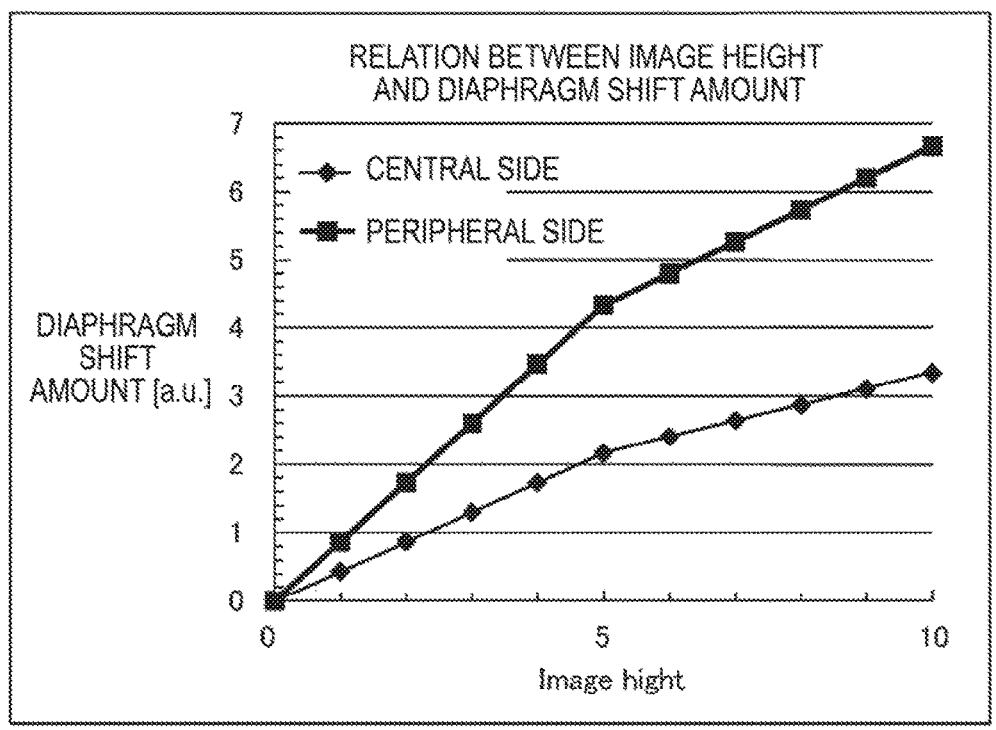
FIG. 12 is an explanatory diagram illustrating an image height and a shift amount.

A case in which the shift amount illustrated in FIG. 11 increases at the same ratio in proportion to the image height is illustrated. As illustrated in FIG. 12, however, a shift amount may not increase at the same ratio in accordance with the image height. Referring to FIG. 12, a slope from the image height of proportion 0 to the image height of proportion 5 is not the same as a slope from the image height of proportion 5 to the image height of proportion 10.

In this way, the shift amount may be set on the basis of a graph in which a slope is not simply proportional in accordance with the image height but is changed at a predetermined image height. The reason why the shift amount is set in this way will be described with reference to FIG. 13.

Figure 13:
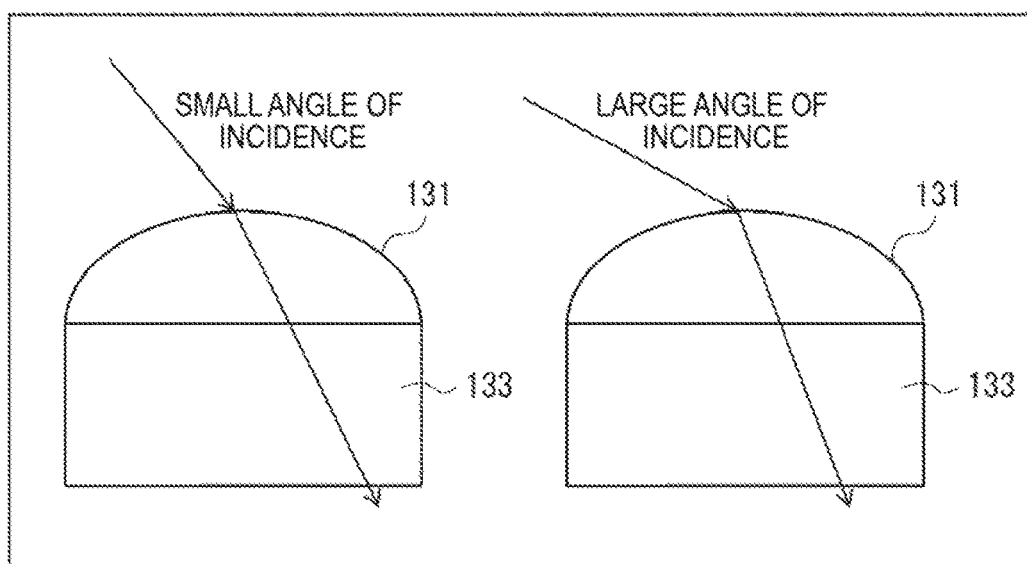
FIG. 13 is an explanatory diagram illustrating refraction of light in an on-chip lens.

Although not illustrated in FIG. 13, when the image height of the optical lens 102 (see FIG. 2) is changed, an angle of incidence light incident on the on-chip lens 131 is also changed. The left drawing of FIG. 13 illustrates a case in which an angle of incidence of the incident light incident on the optical lens 102 is small. The right drawing of FIG. 13 illustrates a case in which the angle of incidence is large.

Also, as illustrated in FIG. 13, the on-chip lens 131 has a spherical shape. From this, an angle of the incident light incident on the optical lens 102 is not proportional to an angle of light after refracted in the on-chip lens 131 in some cases. Accordingly, as illustrated in FIG. 12, by setting a shift amount on the basis of the graph in which the slope is different at a predetermined image height, it is possible to obtain the advantage of transmitting light necessary in the aperture 301 and the advantageous effect of cutting unnecessary light at the maximum.

In addition, the case in which two slopes are set is illustrated in FIG. 12, but the number of set slopes may be two or more. Also, in a case in which the advantageous effect at the time of setting of the shift amount using the graph in which the plurality of slopes illustrated in FIG 12 are set can be neglected or may not be necessarily considered, the shift amount may be set applying the graph in which one slope illustrated in FIG. 11 is set.

The example of the opening 302 illustrated in FIG. 10 is an example of the opening 302 disposed in the horizontal direction (lateral direction) of the screen image 401. Although not illustrated in FIG. 10, openings are also installed on the upper side or the lower side (the vertical direction) of the openings 302-1 to 302-5 and are disposed at the same position in the horizontal direction. The openings 302 are shifted by the same shift amount and have the same opening area.

Figure 14:
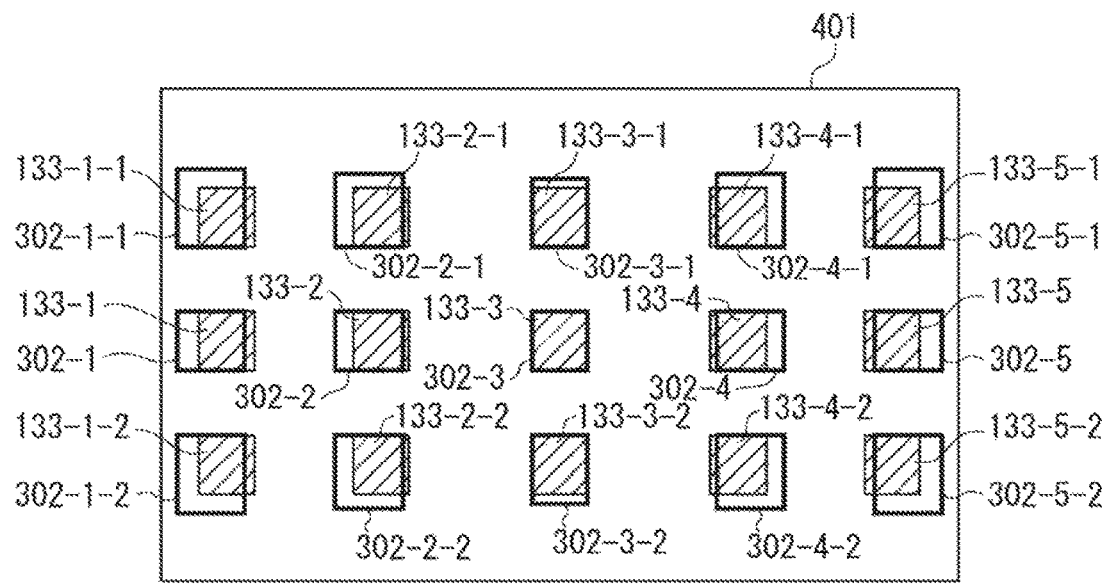
FIG. 14 is an explanatory diagram illustrating shift of the opening.

In this way, the openings 302 may be configured by setting the shift amounts only in the horizontal direction. However, as illustrated in FIG. 14, the openings 302 may be configured by setting shift amount in the horizontal direction and a diagonal direction.

The shift amounts can be set on the basis of the graph illustrated in FIG. 11 or the graph illustrated in FIG. 12. In this case, in a pixel located on the upward left side of the middle, for example, a photodiode 133-2-1, a side of the central side is considered to be the right side of an opening 302-2-1 and sides of the peripheral side is considered to the left side and the upper side of the opening 302-2-1. Also, a lower side of the opening 302-2-1 is a side in the vertical direction. Therefore, in this case, the lower side is not a shift target side.

Also, in a pixel located on the upward right side of the middle, for example, a photodiode 133-4-1, a side of the central side is considered to be the left side of an opening 302-4-1 and sides of the peripheral side are considered to be the right side and the upper side of the opening 302-4-1. Also, the lower side of the opening 302-4-1 is a side in the vertical direction. Therefore, in this case, the lower side is not a shift target side.

Also, in a pixel located on the downward left side of the middle, for example, a photodiode 133-2-2, a side of the central side is considered to be the right side of an opening 302-2-2 and sides of the peripheral side are considered to be the left side and the lower side of the opening 302-2-2. Also, the upper side of the opening 302-2-2 is a side in the vertical direction. Therefore, in this case, the upper side is not a shift target side.

Also, in a pixel located on the downward right side of the middle, for example, a photodiode 133-4-2, a side of the central side is considered to be the left side of an opening 302-4-2 and sides of the peripheral side are considered to be the right side and the lower side of the opening 302-4-2. Also, the upper side of the opening 302-4-2 is a side in the vertical direction. Therefore, in this case, the upper side is not a shift target side.

In this way, the sides in the vertical direction are not shifted and the sides in the horizontal direction and the sides in the diagonal direction are shifted.

Figure 15:
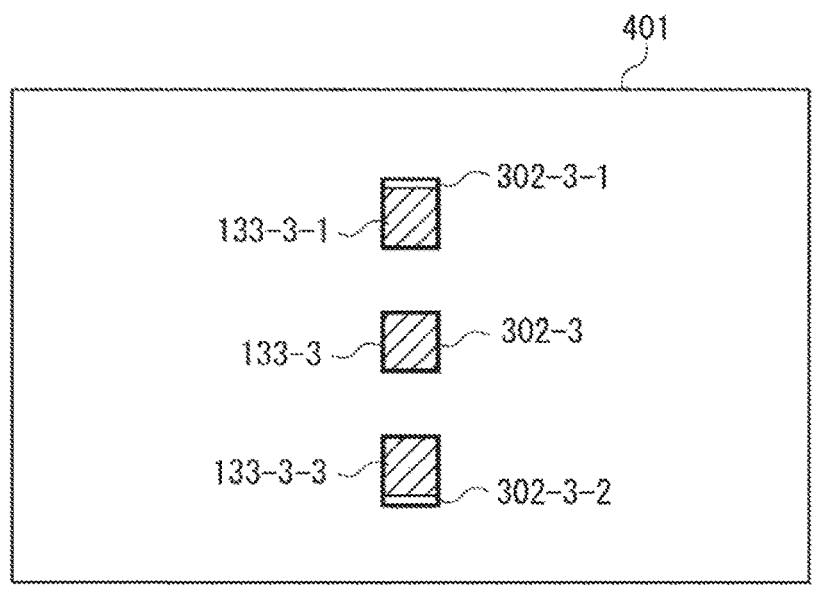
FIG. 15 is an explanatory diagram illustrating shift of the opening.

As illustrated in FIG. 15, the sides may be shifted only in the vertical direction. FIG. 15 is a diagram illustrating an example of a case in which the shift amounts of the openings 302 of the aperture 301 are applied only in the vertical direction. The photodiodes 133 (the pixels) of the upper substrate 111A in the first layer are shifted only in the vertical direction and are not shifted in the horizontal direction.

An opening 302-3-1 disposed at the location of the photodiode 133-3-1 disposed on the upward side of the pixel (the photodiode 133-3) located in the middle is shifted in the upward direction. Also, an opening 302-3-2 disposed at the location of the photodiode 133-3-2 disposed on the downward side of the photodiode 133-3 is shifted in the downward direction.

Although the other pixels are not illustrated, the openings 302 disposed on the upward side of the middle are shifted in the upward direction and the openings 302 disposed to the downward side of the middle are shifted in the downward direction, as in the openings 302-3-1 and 302-3-2.

The shift amounts in a case in which the openings 302 are shifted in the vertical direction can also be set on the basis of the graph illustrated in FIG. 11 or 12. In this case, in the pixel located on the upward side of the middle, for example, the photodiode 133-3-1, a side of the central side is considered to be the lower side of the opening 302-3-1 and a side of the peripheral side is considered to be the upper side of the opening 302-3-1.

Also, in the pixel located on the downward side of the middle, for example, in the photodiode 133-3-2, a side of the central side is considered to be the upper side of the opening 302-3-2 and a side of the peripheral side is considered to be the lower side of the opening 302-3-2.

In this way, the openings may be shifted only in the vertical method.

Figure 16:
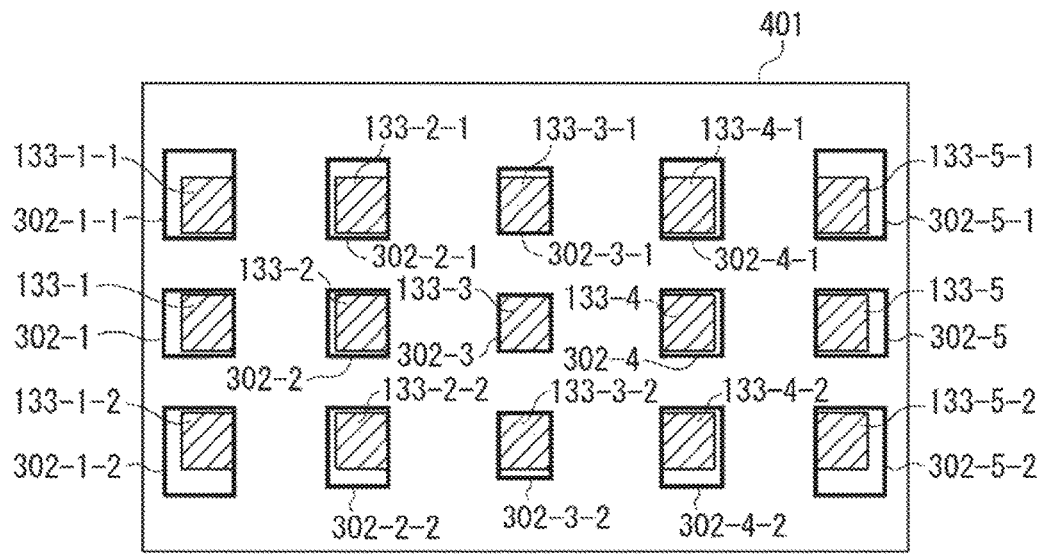
FIG. 16 is an explanatory diagram illustrating shift of the opening.

Further, as illustrated in FIG. 16, the openings may be shifted in the vertical direction and the diagonal direction. The openings 302 of the aperture 301 are shifted in the vertical direction and the diagonal direction from the predetermined pixels (the photodiodes 133) of the upper substrate 111a in the first layer.

The shift amounts can be set on the basis of the graph illustrated in FIG. 11 or the graph illustrated in FIG. 12. In this case, in a pixel located on the upward left side of the middle, for example, a photodiode 133-2-1, a side of the central side is considered to be the lower side of an opening 302-2-1 and sides of the peripheral side is considered to the left side and the upper side of the opening 302-2-1. Also, a right side of the opening 302-2-1 is a side in the horizontal direction. Therefore, in this case, the lower side is not a shift target side.

Also, in a pixel located on the upward right side of the middle, for example, a photodiode 133-4-1, a side of the central side is considered to be the lower side of an opening 302-4-1 and sides of the peripheral side are considered to be the right side and the upper side of the opening 302-4-1. Also, the left side of the opening 302-4-1 is a side in the horizontal direction. Therefore, in this case, the lower side is not a shift target side.

Also, in a pixel located on the downward left side of the middle, for example, a photodiode 133-2-2, a side of the central side is considered to be the upper side of an opening 302-2-2 and sides of the peripheral side are considered to be the left side and the lower side of the opening 302-2-2. Also, the right side of the opening 302-2-2 is a side in the horizontal direction. Therefore, in this case, the upper side is not a shift target side.

Also, in a pixel located on the downward right side of the middle, for example, a photodiode 133-4-2, a side of the central side is considered to be the upper side of an opening 302-4-2 and sides of the peripheral side are considered to be the right side and the lower side of the opening 302-4-2. Also, the left side of the opening 302-4-2 is a side in the horizontal direction. Therefore, in this case, the upper side is not a shift target side.

In this way, the sides in the horizontal direction are not shifted and the sides in the vertical direction and the sides in the diagonal direction are shifted.

Figure 17:
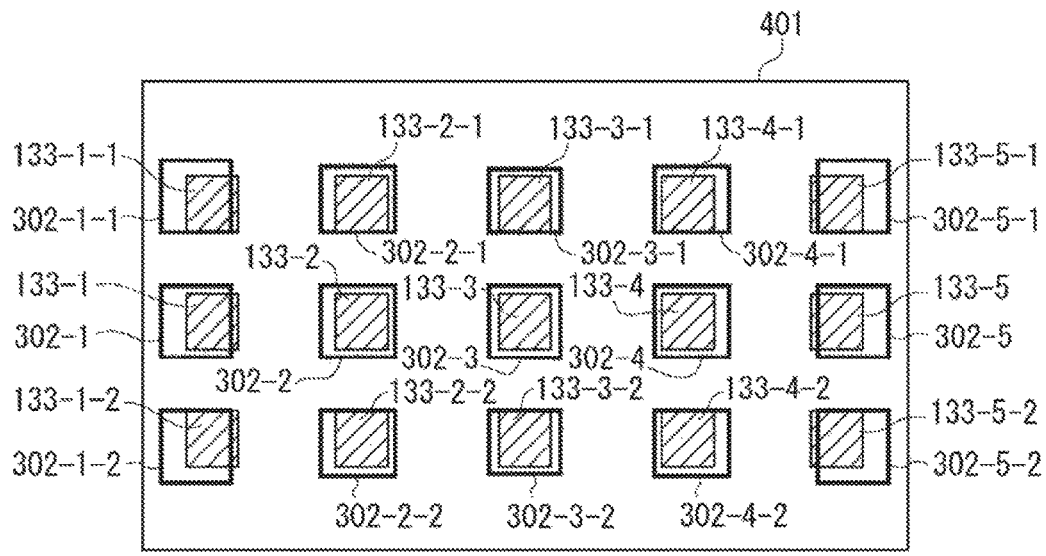
FIG. 17 is an explanatory diagram illustrating shift of the opening.

Further, as illustrated in FIG. 17, the openings may be shifted in the horizontal direction, the vertical direction, and the diagonal direction. The openings 302 of the aperture 301 are shifted in the horizontal direction, the vertical direction, and the diagonal direction from the predetermined pixels (the photodiodes 133) of the upper substrate 111a in the first layer.

The shift amounts can be set on the basis of the graph illustrated in FIG. 11 or the graph illustrated in FIG. 12. In this case, in a pixel located on the upward left side of the middle, for example, a photodiode 133-2-1, a side of the central side is considered to be the lower side and the right side of an opening 302-2-1 and sides of the peripheral side is considered to the upper side and the left side of the opening 302-2-1.

Also, in a pixel located on the upward right side of the middle, for example, a photodiode 133-4-1, a side of the central side is considered to be the lower side and the left side of an opening 302-4-1 and sides of the peripheral side are considered to be the upper side and the right side of the opening 302-4-1.

Also, in a pixel located on the downward left side of the middle, for example, a photodiode 133-2-2, a side of the central side is considered to be the upper side and the right side of an opening 302-2-2 and sides of the peripheral side are considered to be the lower side and the left side of the opening 302-2-2.

Also, in a pixel located on the downward right side of the middle, for example, a photodiode 133-4-2, a side of the central side is considered to be the upper side and the left side of an opening 302-4-2 and sides of the peripheral side are considered to be the lower side and the right side of the opening 302-4-2.

In this way, the sides related in the horizontal direction, the vertical direction, and the diagonal direction are shifted. In addition, here, the shift amounts are set separately on the central side and the peripheral side. Therefore, even when the sides related in the horizontal direction, the vertical direction, and the diagonal direction are shifted, four sides of the openings 302 can be each shifted by performing the process of shifting the sides related in the horizontal direction and the vertical direction. Accordingly, the process of shifting the sides related in the horizontal direction and the vertical direction may be performed.

Also, in the foregoing examples, the sides of the openings 302 are separated on the central side or the peripheral side and the sides of the corresponding openings 302 are shifted, as described above. However, the shift amounts of the corresponding sides in, for example, a diagonal direction may be set in addition to the central side and the peripheral side.

<Embodiment in which Pixels in Second Layer are Set to Phase Difference Detection Pixels>

As described above, in a case in which the openings 302 of the aperture 301 are disposed by changing the positions or sizes in accordance with the image height, the pixels disposed in the lower substrate 111B in the second layer may be set to phase difference detection pixels.

Figure 18:
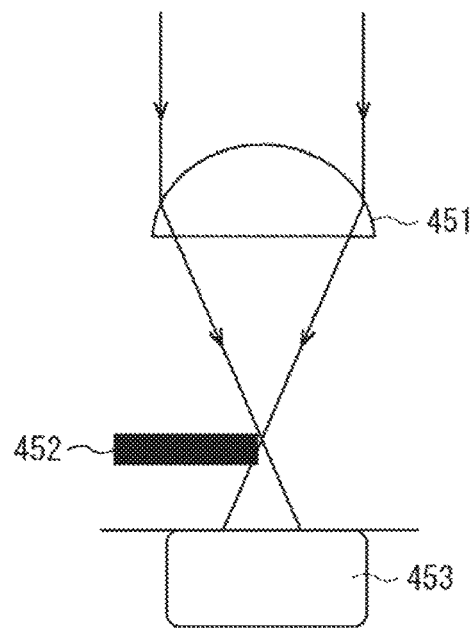
FIG. 18 is an explanatory diagram illustrating a phase difference detection pixel.

Here, general phase difference detection pixels will be further described in brief. FIG. 18 is a diagram illustrating a configuration of the phase difference detection pixel with a single-layered structure. In the phase difference detection pixel, a light-shielding film 452 that shields light from an on-chip lens 451 is configured to be installed between the on-chip lens 451 and a photodiode 453. A part of light incident via the on-chip lens 451 is shielded by installing the light-shielding film 452 and a part of the light is received in the photodiode 453.

A left light-shielding pixel (see FIG. 18) in which the light-shielding film 452 is installed to the left and a right light-shielding pixel (not illustrated) in which the light-shielding film 452 is installed to the right are installed in parts of a pixel array unit. The right light-shielding pixel and the left light-shielding pixel are used as a pair of phase difference detection pixels. A function (separation capability) of selecting an angle of incidence of light and receiving the light is configured to be realized when light is shielded on the right side or the left side.

When the right light-shielding pixel and the left light-shielding pixel are installed, incident light can be separated to be received. When the photodiodes receive the light arriving from the left portion and the light arriving from the right portion, a focus position can be detected.

That is, at the time of rear focus or the time of front focus, an output from the photodiode in which the light is shielded on the right side does not match an output from the photodiode in which the light is shielded on the left side (outputs of the paired phase difference detection pixels match). However, at the time of focus, outputs from the two photodiodes match (the outputs of the paired phase difference detection pixels match). Detection of the focus is realized by moving the lens group 21 up to a focused position at the time of determination of the rear focus or the front focus.

Figure 19:
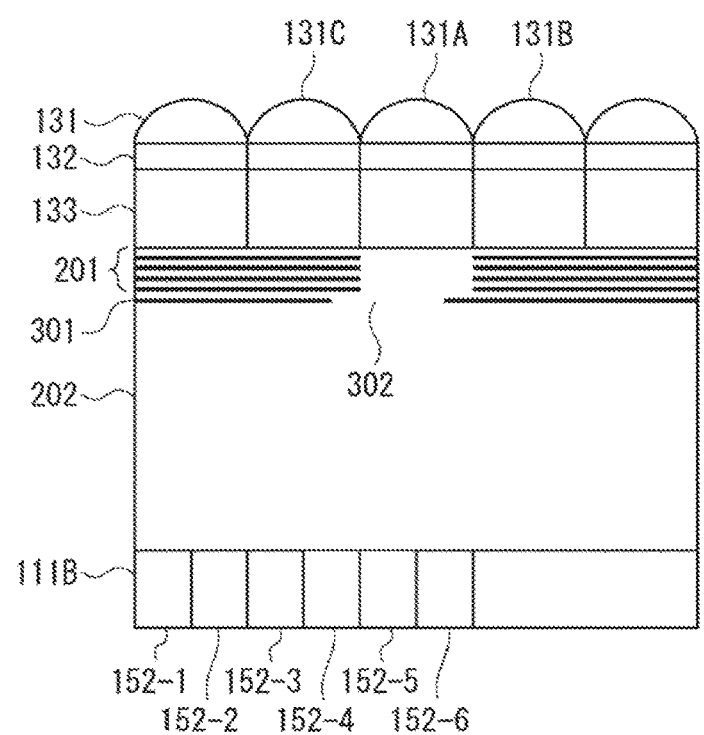
FIG. 19 is an explanatory diagram illustrating disposition of the phase difference detection pixel.

In the image sensor 101 to which the present technology is applied, as illustrated in FIG. 19, photodiodes 152-1 to 152-6 disposed in the lower substrate 111B in the second layer can be set as phase difference detection pixels. Also, as described above, the openings 302 of the aperture 301 is shifted by a shift amount in accordance with the image height with respect to a transmission pixel to be disposed.

Hereinafter, the photodiodes 152-1 to 152-6 are described as phase difference detection pixel groups 153. In a case in which the phase difference detection pixel groups 153 are disposed in the lateral direction (the horizontal direction) and a case in which the phase difference detection pixel groups 153 disposed in this way are viewed from information of the image sensor 101, the phase difference detection pixel groups 153 are disposed as in FIG. 20.

Figure 20:
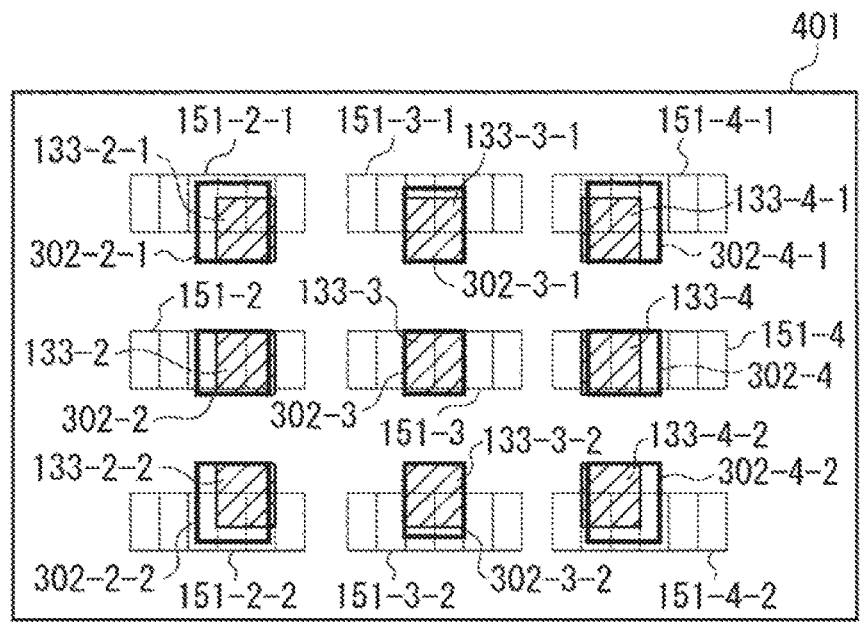
FIG. 20 is an explanatory diagram illustrating disposition of the phase difference detection pixel.

FIG. 20 illustrates a state in which nine transmission pixels (the photodiodes 133) are disposed in the screen image 401 and the openings 302 of the aperture 301 are installed in the transmission pixels, as in the case illustrated in FIG. 14. In FIG. 20, further, the phase difference detection pixel group 153 disposed in the lower substrate 111B is disposed below each opening 302 (in the lower substrate 111B).

In the example illustrated in FIG. 20, for example, the phase difference detection pixel group 153 located at the position of the opening 302-3 in the middle is disposed at a position at which the center of the opening 302-3 substantially overlaps the center of the phase difference detection pixel group 153-3.

A phase difference detection pixel group 153-3-1 located at the position of the opening 302-3-1 located on the upward side of the middle is disposed at a position shifted upward from the opening 302-3-1. Also, a phase difference detection pixel group 153-2-1 located at the position of the opening 302-2-1 located on the upward left side is disposed at a position shifted upward and shifted to the left from the opening 302-2-1.

A phase difference detection pixel group 153-4-1 located at the position of the opening 302-4-1 located on the upward right side is disposed at a position shifted upward and shifted to the right from the opening 302-4-1.

In this way, the phase difference detection pixel groups 153 are disposed at the positions shifted by the predetermined amounts from the openings 302 in accordance with the image height.

As illustrated in FIGS. 19 and 20, in a case in which the phase difference detection pixels are configured to be arranged in the lateral direction and detect a phase difference in the lateral direction, as described with reference to FIG. 10 or 14, it is compatible that the shift amounts are set in the horizontal direction (the lateral direction) and the positions or sizes of the openings 302 are set.

Also, although not illustrated, the phase difference detection pixel groups 153 may be disposed in the longitudinal direction (the vertical direction). In a case in which the phase difference detection pixel groups 153 are disposed in the longitudinal direction and a phase difference is detected in the longitudinal direction, as described with reference to FIG. 15 or 16, it may be compatible that the shift amounts are set in the vertical direction (the longitudinal direction) and the positions or sizes of the openings 302 are set.

Figure 21:
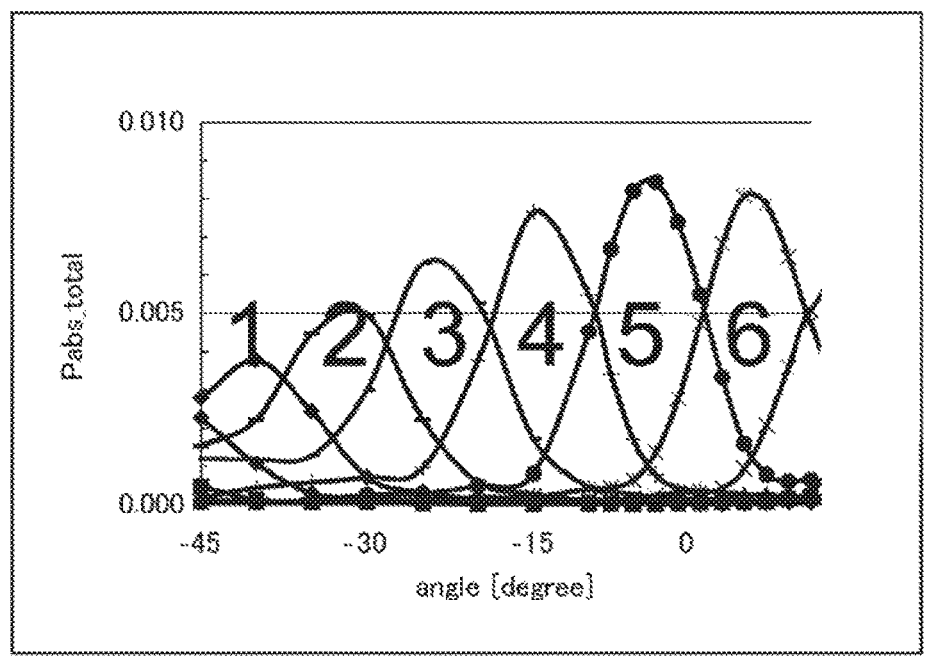
FIG. 21 is an explanatory diagram illustrating a phase difference detection result.

As described in FIG. 19, in a case in which the phase difference detection pixel groups 153 are installed and the photodiodes 152-1 to 152-6 are disposed as the phase difference detection pixels, a graph illustrated in FIG. 21 can be obtained by plotting the amounts of incident light received by the photodiodes 152-1 to 152-6 as a graph.

FIG. 21 is a graph illustrating a phase difference characteristic result. The horizontal axis represents an angle of incident light and the vertical axis represents an amount of received light. Also, numerals in the drawing indicate the photodiodes 152-1 to 152-6. For example, "1" indicates the photodiode 152-1.

As illustrated in FIG. 21, the amounts of light received by the photodiodes 152-1 to 152-6 are plotted as a graph with peaks at angles (angle of incidence) of predetermined incident light.

For example, for the photodiode 152-3, an angle of incidence has a peak at about −20 degrees. For the photodiode 152-4, an angle of incidence has a peak at about −15 degrees.

For example, when the angle of incidence is about −20 degrees, a phase difference can be sought using a signal which can be obtained from the photodiode 152-3. When the angle of incidence is about −15 degrees, a phase difference can be sought using a signal obtained from the photodiode 152-4.

That is, by installing the phase difference detection pixel group 153 and disposing the plurality of phase difference detection pixels, the phase difference can be sought using the signal from the photodiode 152 capable of obtaining a largest signal in accordance with an angle of the incident light and autofocus can be performed.

In addition, in the phase difference detection pixels, two pixels are paired. However, two pixels in one phase difference detection pixel group 153 may be selected and a phase difference may be detected. One pixel may be selected from each of two phase difference detection pixel groups 153 disposed at different positions and a phase difference may be detected from the selected two pixels.

In a case in which the pixels disposed in the lower substrate 111B are set as the phase difference detection pixels, as described with reference to FIG. 18, the right light-shielding film pixels and the left light-shielding film pixels can also be configured using the light-shielding film 452 and can be configured to detect a phase difference. Also, even in such a configuration, as described above, the openings 302 of the aperture 301 are shifted by the shift amounts in accordance with the image height with respect to the transmission pixels to be disposed.

Figure 22:
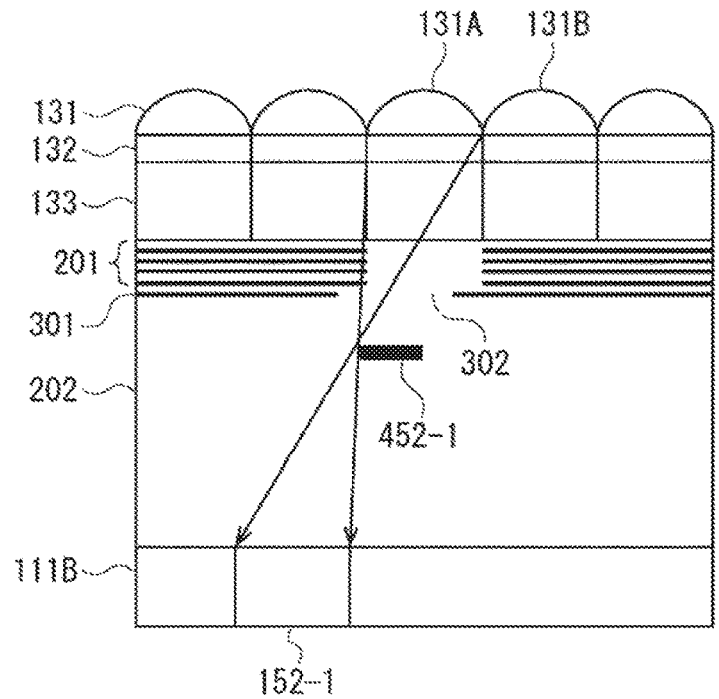
FIG. 22 is an explanatory diagram illustrating a configuration of a light-shielding pixel.
Figure 23:
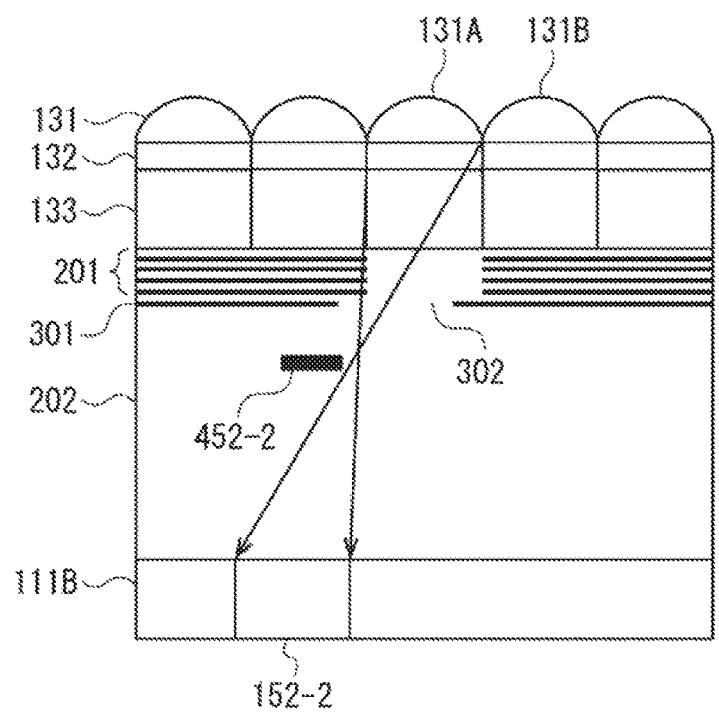
FIG. 23 is an explanatory diagram illustrating a configuration of a light-shielding pixel.

FIG. 22 is a diagram illustrating a configuration of the right light-shielding pixels and FIG. 23 is a diagram illustrating a configuration of the left light-shielding pixels. In the right light-shielding pixels illustrated in FIG. 22, a light-shielding film 452-1 is installed in an inter-layer insulation film 202. Of light transmitted through the opening 302, light from the right is shielded by the light-shielding film 452-1 and light from the left is received by the photodiode 152-1 installed in the lower substrate 111B.

In the left light-shielding pixels illustrated in FIG. 23, a light-shielding film 452-2 is installed in the inter-layer insulation film 202. Of light transmitted through the opening 302, light from the left is shielded by the light-shielding film 452-2 and light from the right is received by the photodiode 152-2 installed in the lower substrate 111B.

Figure 24:
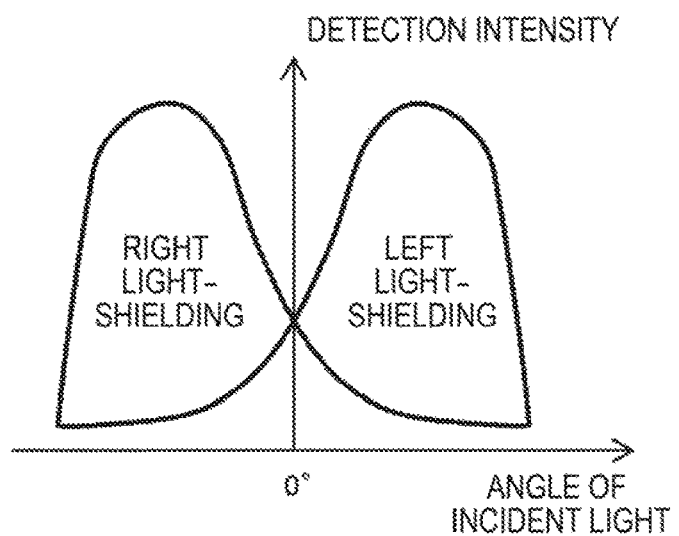
FIG. 24 is an explanatory diagram illustrating detection intensity in the light-shielding pixel.

When detection intensity of the right light-shielding pixels illustrated in FIG. 22 and detection intensity of the left light-shielding pixels illustrated in FIG. 23 are plotted as a graph, a graph illustrated in FIG. 24 can be obtained. As illustrated in FIG. 24, a phase difference occurs between the right light-shielding pixels and the left light-shielding pixels and focus is adjusted so that the phase difference is minimized, as described with reference to FIG. 18.

In the image sensor 101 to which the present technology is applied, the light-shielding film is installed between the upper substrate 111A and the lower substrate 111B and the phase difference detection pixels are installed on the lower substrate 111B. In such a configuration, it is possible to resolve a defect such as mixed color which can occur in the light-shielding pixels with the configuration illustrated in FIG. 18.

Figure 25:
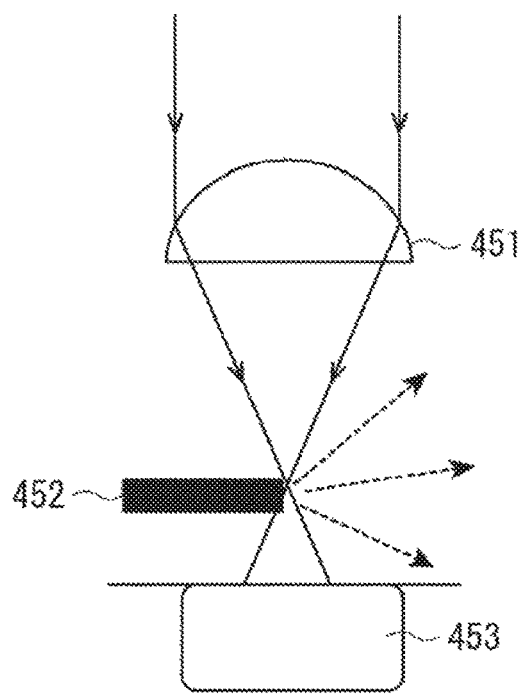
FIG. 25 is an explanatory diagram illustrating occurrence of mixed color.

The mixed color will be described with reference to FIG. 25. FIG. 25 is a diagram in which light causing mixed color is indicated by dotted arrows in the configuration of the light-shielding pixels illustrated in FIG. 18. Light incident via the on-chip lens 451 is shielded by the light-shielding film 452 and part of the light may be reflected and incident on the photodiodes (not illustrated) of the adjacent pixels.

In this way, the incident light is reflected from the light-shielding film 452 and is leaked as mixed color to adjacent pixels, and thus there is a possibility of an adverse influence on image quality.

However, in the image sensor 101 to which the present technology is applied, as illustrated in FIG. 19, no light-shielding film is installed. Therefore, it is possible to prevent the mixed color from occurring due to the light-shielding films. Also, as illustrated in FIGS. 22 and 23, the light-shielding film 452 is installed below the upper substrate 111A in the first layer even in the configuration in which the light-shielding film 452 is installed. Therefore, there is no influence on an image obtained through imaging with the pixels of the upper substrate 111A in the first layer.

Accordingly, even in a case in which the light-shielding film 452 is installed, it is possible to prevent the mixed color from occurring due to the light-shielding film 452.

In addition, in FIGS. 22 and 23, the example in which the phase difference detection pixel installed in the lower substrate 111B is configured as one photodiode 152 rather than the pixel group has been described. However, the phase difference detection pixel group 153 illustrated in FIG. 19 may be used.

Also, the photodiodes 152 illustrated in FIGS. 22 and 23 are disposed at the positions shifted in accordance with the image height with respect to the openings 302 in the horizontal direction or the vertical direction. Even in this case, in the case in which the paired phase difference detection pixels are disposed in the lateral direction, as described with reference to FIG. 20, it is compatible that the shift amounts are set in the horizontal direction (the lateral direction) and the positions or sizes of the openings 302 are set, as described with reference to FIGS. 10 and 14.

Also, although not illustrated, in a case in which the phase difference detection pixels are disposed in the longitudinal direction (the vertical direction) and the phase difference is detected in the longitudinal direction, it may be compatible that the shift amounts are set in the vertical direction (the longitudinal direction) and the positions or sizes of the openings 302 are set, as described with reference to FIGS. 15 and 16.

In this way, even in the case in which the pixels disposed in the lower substrates 111B are set as the phase difference detection pixels, the openings 302 of the aperture 301 are disposed at the positions shifted in accordance with the image height with respect to the transmission pixels. Therefore, in a state in which mixed color or the like does not occur, the phase difference can be detected. Accordingly, it is possible to detect the phase difference with improved precision and it is possible to improve performance of autofocus.

<Configuration in which a Light-shielding Film in a Grid State is Included>

Figure 26:
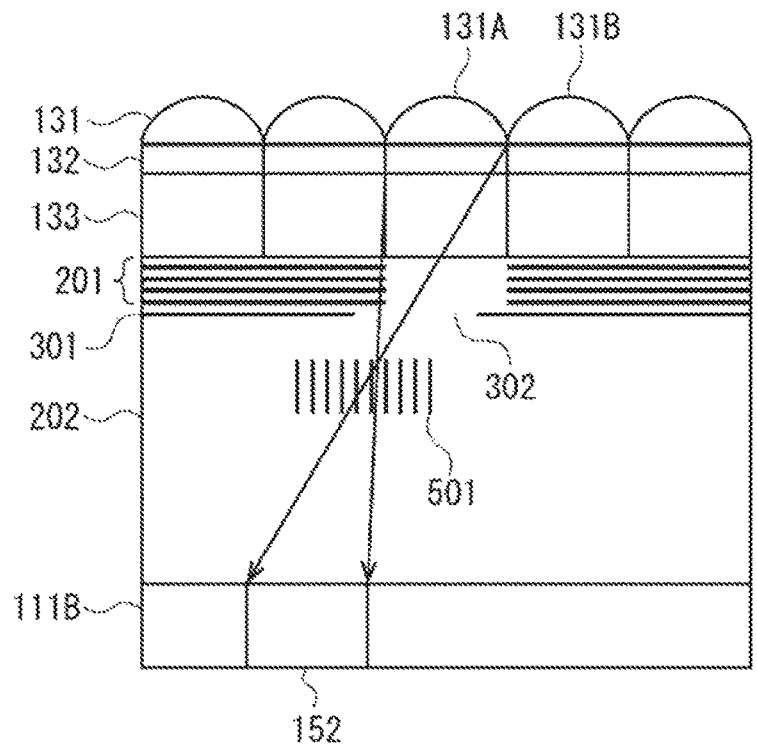
FIG. 26 is an explanatory diagram illustrating a configuration of a grid light-shielding film.

In a case in which a light-shielding film is installed in the inter-layer insulation film 202, as illustrated in FIG. 26, a light-shielding film in a grid state may be installed. Even in such a configuration, as described above, the openings 302 of the aperture 301 are shifted by the shift amounts in accordance with the image height with respect to the transmission pixels to be disposed.

The image sensor 101 illustrated in FIG. 26 is configured so that grid light-shielding films 501 in a grid state are installed in the inter-layer insulation film 202 and incident light is incident on the photodiodes 152 installed in the lower substrate 111B via the grid light-shielding films 501.

Figure 27:
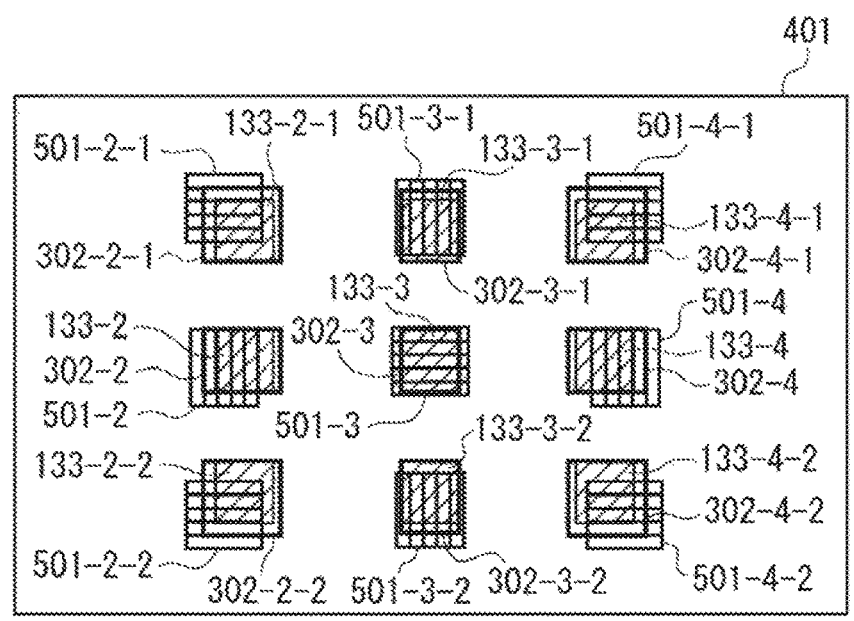
FIG. 27 is an explanatory diagram illustrating a configuration of a grid light-shielding film.

By installing the grid light-shielding films 501 and causing a difference in a direction of grids, it is possible to create a parallax because of the difference between the directions of the grids, which can be applied to a stereo camera or the like. FIG. 27 is a diagram illustrating an example when the difference is caused in the direction of the grids.

FIG. 27 illustrates a state in which nine transmission pixels (the photodiodes 133) are disposed in the screen image 401 and the openings 302 of the aperture 301 are installed in the transmission pixels, as in the case illustrated in FIG. 14. In FIG. 27, the grid light-shielding films 501 are further disposed between the upper substrate 111A and the lower substrate 111B.

In the example illustrated in FIG. 27, the grid light-shielding films 501 of the grids in the horizontal (lateral) direction and the grid light-shielding films 501 of the grids in the vertical (longitudinal) direction are mixed. Also, the grid light-shielding films 501 of the grid in the horizontal direction and the grid light-shielding films 501 of the grids in the vertical direction are disposed to be adjacent to each other.

That is, the grid light-shielding film 501-3 located in the middle of the screen image 401 is a grid in the horizontal direction. A grid light-shielding film 501-2 located to the left of the screen image 401 and a grid light-shielding film 501-4 located to the right thereof are set as grids in the vertical direction.

Also, a grid light-shielding film 501-3-1 located on the upward side of the grid light-shielding film 501-3 located in the middle of the screen image 401 and a grid light-shielding film 501-3-2 located on the downward side of the grid light-shielding film 501-3 are set as grids in the vertical direction.

In this way, the directions of the adjacent grid light-shielding films 501 are configured to be different from each other.

Also, the grid light-shielding films 501 are configured to be disposed in conformity with the openings 302 shifted in accordance with the image height and disposed at positions shifted with respect to the openings 302. In the example illustrated in FIG. 27, for example, the grid light-shielding film 501 located at the position of the opening 302-3 in the middle is disposed at a position at which the center of the opening 302-3 substantially overlaps the center of the grid light-shielding film 501-3.

Also, the grid light-shielding film 501-3-1 located at the position of the opening 302-3-1 located on the upward side of the middle is disposed at a position shifted upward from the opening 302-3-1. Also, a grid light-shielding film 501-2-1 located at the position of the opening 302-2-1 located on the upward left side is disposed at a position shifted upward and shifted to the left from the opening 302-2-1. Also, a grid light-shielding film 501-4-1 located at the position of the opening 302-4-1 located on the upward right side is disposed at a position shifted upward and shifted to the right from the opening 302-4-1.

In this way, the grid light-shielding films 501 are disposed at the positions shifted by the predetermined amounts from the openings 302 in accordance with the image height.

In a case in which the grid light-shielding films 501 are installed, it is compatible that the shift amounts are set in the horizontal direction (the lateral direction), the vertical direction (the longitudinal direction), and the diagonal direction in regard to the positions or sizes of the openings 302, as described with reference to FIG. 17.

The case in which the shapes of the grids of the grid light-shielding films 501 are in the longitudinal direction or the lateral direction illustrated in FIG. 27 has been described as an example, but other shapes may be used. For example, as illustrated in FIG. 28, a grid shape in a diagonal direction may be used.

Figure 28:
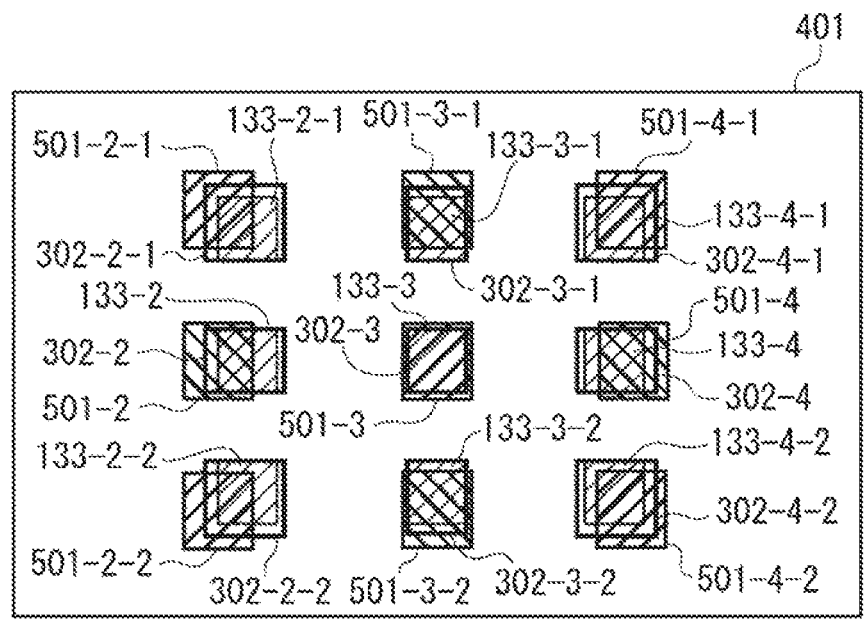
FIG. 28 is an explanatory diagram illustrating another configuration of the grid light-shielding film.

The direction of the grids of the grid light-shielding films 501 illustrated in FIG. 28 is oriented to the downward right side at 45 degrees (hereinafter referred to as the downward right direction) or is oriented to the downward left side at 45 degrees (hereinafter referred to as the downward left direction). That is, in the example illustrated in FIG. 28, the grid light-shielding films 501 in the downward right direction and the grid light-shielding films 501 in the downward left direction are mixed.

The grid light-shielding films 501 of the grids in the downward right direction and the grid light-shielding films 501 of the grids in the downward left direction are disposed to be adjacent to each other. That is, the grid light-shielding film 501-3 located in the middle of the screen image 401 is a grid in the downward left direction. The grid light-shielding film 501-2 located to the left of the screen image 401 and the grid light-shielding film 501-4 located to the right thereof are set as grids in the downward right direction.

Also, grid light-shielding film 501-3-1 located on the upward side of the grid light-shielding film 501-3 located in the middle of the screen image 401 and the grid light-shielding film 501-3-2 located on the downward side thereof are set as grids in the downward right direction.

In this way, the directions of the grids of the adjacent grid light-shielding films 501 are set to be different from each other. Also, as in the case illustrated in FIG. 27, the grid light-shielding films 501 are disposed at the positions shifted by the predetermined amounts in accordance with the image height with respect to the openings 302.

Figure 29:
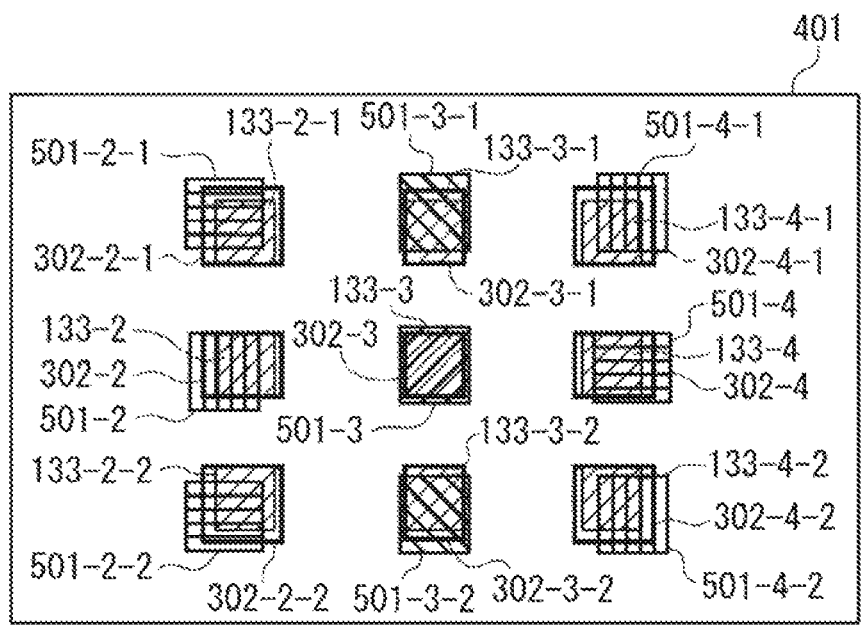
FIG. 29 is an explanatory diagram illustrating another configuration of the grid light-shielding film.

Further, as illustrated in FIG. 29, the grid light-shielding films 501 in the horizontal direction, the grid light-shielding films 501 in the vertical direction, the grid light-shielding films 501 in the downward right direction, and the grid light-shielding films 501 in the downward left direction can also be configured to be mixed.

In the example illustrated in FIG. 29, the grid light-shielding film 501-3 located in the middle of the screen image 401 is a grid in the downward left direction, the grid light-shielding film 501-2 located on the left side thereof is a grid in the vertical direction, and the grid light-shielding film 501-4 located on the right side is a grid in the horizontal direction.

Also, a grid light-shielding film 501-3-1 located on the upward side of the grid light-shielding film 501-3 located in the middle of the screen image 401 and a grid light-shielding film 501-3-2 located on the downward side of the grid light-shielding film 501-3 are set as grids in the lower right direction.

Also, a grid light-shielding film 501-2-1 located on the upper left side of the grid light-shielding film 501-3 located in the middle of the screen image 401 and a grid light-shielding film 501-2-2 located on the lower left side of the grid light-shielding film 501-3 are set as grids in the horizontal direction.

Also, a grid light-shielding film 501-4-1 located on the upper right side of the grid light-shielding film 501-3 located in the middle of the screen image 401 and a grid light-shielding film 501-4-2 located on the lower right side of the grid light-shielding film 501-3 are set as grids in the vertical direction.

Also in the case of FIG. 29, the directions of the adjacent grid light-shielding films 501 are set to be different from each other. Also, as in the case illustrated in FIG. 27, the grid light-shielding films 501 are disposed at the positions shifted by the predetermined amounts in accordance with the image height with respect to the openings 302.

In this way, in a case in which the grid light-shielding films 501 with the grid shapes are disposed in the image sensor 101, a parallax is created because of the difference between the directions of the grids, which can be applied to a stereo camera or the like.

Even in a case in which the grid light-shielding films 501 are installed as in the case of the phase difference detection pixels described with reference to FIGS. 19 to 25, the incident light is reflected from the grid light-shielding films 501 and is leaked as mixed color to adjacent pixels, and thus there is a possibility of an adverse influence on image quality.

In the image sensor 101 to which the present technology is applied, as illustrated in FIG. 26, the grid light-shielding films 501 are installed below the upper substrate 111A in the first layer. Therefore, there is no influence on an image which can be obtained in the upper substrate 111A in the first layer. Accordingly, even in a case in which the grid light-shielding films 501 are installed, it is possible to prevent mixed color from occurring due to the grid light-shielding films 501.

Also, even in the case in which the grid light-shielding films 501 are installed, the openings 302 of the aperture 301 are disposed at the positions shifted in accordance with the image height with respect to the transmission pixels. Therefore, in a state in which the mixed color or the like does not occur, light can be shielded by the grid light-shielding films 501.

<Configuration in which Narrow-band Filter is Included>

Figure 30:
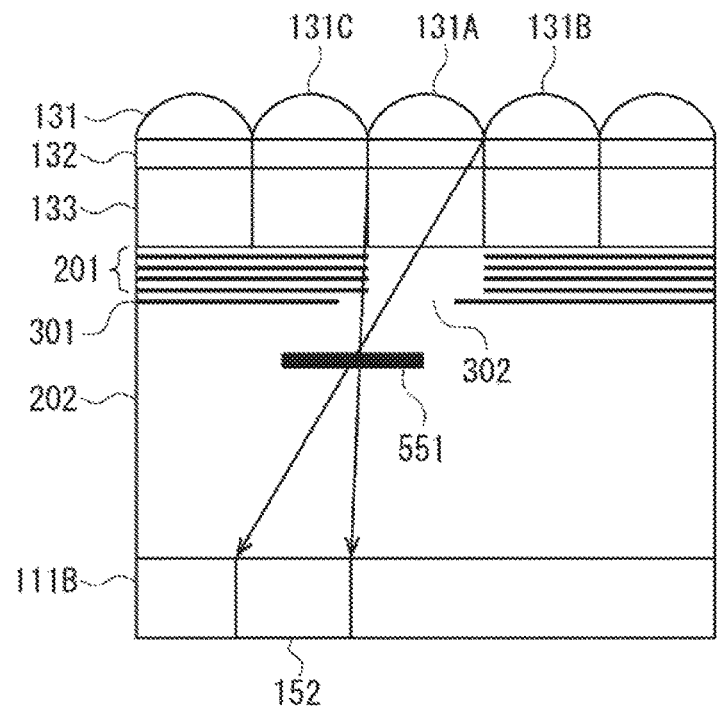
FIG. 30 is a diagram illustrating a configuration of an image sensor in which a narrow-band filter is installed.

A configuration in which a filter is installed in the interlayer insulation film 202 can be realized. FIG. 30 illustrates a configuration of the image sensor 101 in which a narrow-band filter is installed as a filter. The image sensor 101 illustrated in FIG. 30 is configured so that a narrow-band filter 551 is installed in the inter-layer insulation film 202 and incident light is incident on the photodiode 152 installed in the lower substrate 111B via the narrow-band filter 551.

Even in such a configuration, as described above, the openings 302 of the aperture 301 are shifted by the shift amount in accordance with the image height with respect to the transmission pixels to be disposed.

By installing the narrow-band filter 551 in the inter-layer insulation film 202, a wavelength which is desired to be analyzed with the narrow-band filter 551 can be selected from the light transmitted through a predetermined pixel of the upper substrate 111A and the selected light can be received with the photodiode 152. That is, it is possible to realize the image sensor 101 capable of selectively extracting the wavelength which is desired to be analyzed.

In the upper substrate 111A, the pixels are disposed in a 2-dimensional array form. Then, of the pixels disposed in the 2-dimensional array form, the openings 302 are installed in predetermined pixels set as the transmission pixels and the narrow-band filters 551 are installed in the locations of the openings 302. Accordingly, the plurality of narrow-band filters 551 are installed in the image sensor 101.

All the plurality of installed narrow-band filters 551 may be set as the same filters. Also, by setting the plurality of installed narrow-band filters 551 as filter that extract different wavelengths, it is possible to realize the image sensor 101 capable of extracting multi-spectrum or hyper-spectrum data.

Even in this case, since the narrow-band filters 551 are installed between the upper substrate 111A and the lower substrate 111B, the narrow-band filters 551 does not affect an image captured by the pixels of the upper substrate 111A and it is possible to prevent image quality from deteriorating.

<Configuration in which Plasmon Filter is Included>

Figure 31:
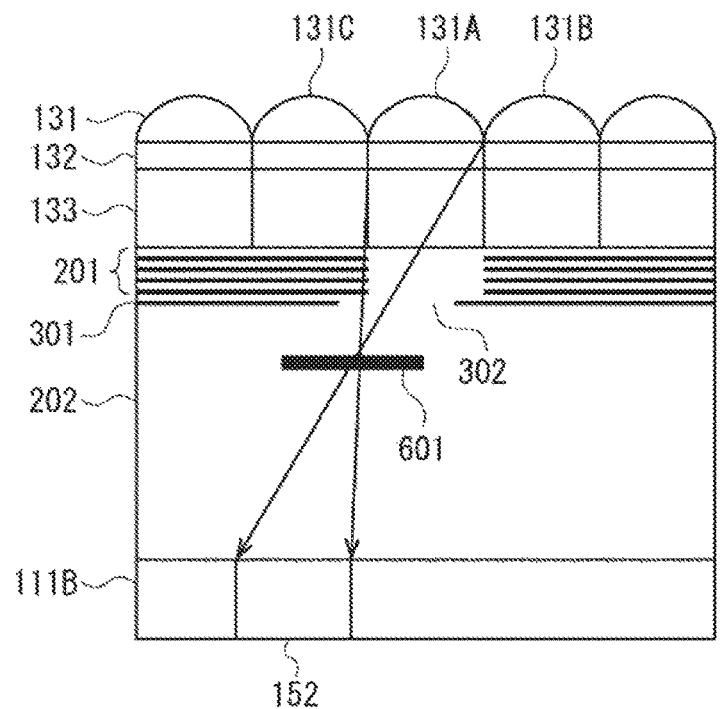
FIG. 31 is a diagram illustrating a configuration of an image sensor in which a plasmon filter is installed.

FIG. 31 illustrates a configuration of the image sensor 101 in which a plasmon filter is installed as a filter. The image sensor 101 illustrated in FIG. 31 is configured so that a plasmon filter 601 is installed in the inter-layer insulation film 202 and incident light is incident on the photodiode 152 installed in the lower substrate 111B via the plasmon filter 601.

Even in such a configuration, as described above, the openings 302 of the aperture 301 are shifted by the shift amount in accordance with the image height with respect to the transmission pixels to be disposed.

Figure 32:
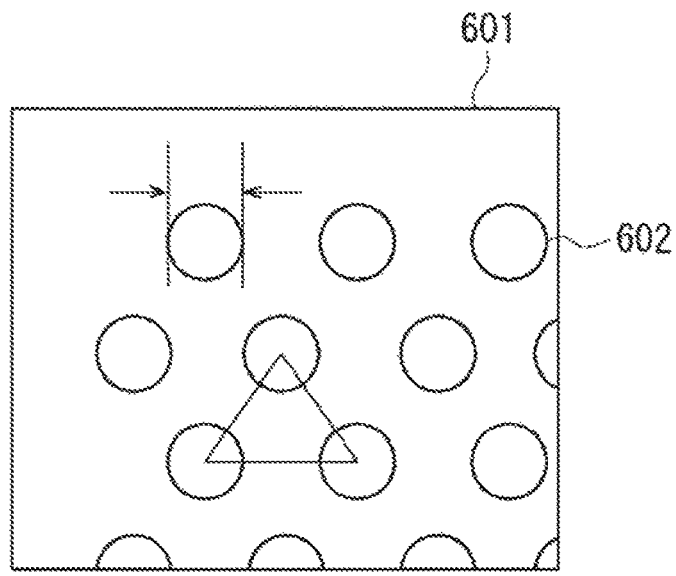
FIG. 32 is a diagram illustrating a configuration of the plasmon filter.

The plasmon filter 601 is a filter that performs spectroscopy and a filter in which a plasmon resonator is used as a filter. A configuration of the plasmon filter 601 is illustrated in FIG. 32. The plasmon resonator is a sub-wavelength structure formed by performing minute processing on a thin film formed of a conductor material (specifically gold, silver, copper, or the like; particularly aluminum, nickel, or the like is appropriate).

The plasmon resonator has a resonance wavelength decided in accordance with a physical property or a pattern period of a conductor, an opening diameter, a dot size, a film thickness, a medium around the structure, or the like. A basic structure of the plasmon resonator is a hole array structure and is a structure in which holes (through holes 602 or non-through holes 602) with a diameter less than a detection wavelength are disposed in a 2-dimensional array form. The holes are filled with a dielectric material. Also, a considerably preferable disposition of the holes is a honeycomb or an orthogonal matrix. A structure which has periodicity in another disposition can be applied.

For example, the plasmon filter 601 illustrated in FIG. 32 is configured by a plasmon resonator in which the through holes 602 are disposed in a conductor thin film in a honeycomb form. An opening diameter of the through hole 602 may be less than the wavelength of light which is desired to be transmitted. For example a diameter of about 100 nm is considered.

A transmission wavelength in which light is transmitted through the plasmon filter 601 is set by adjusting an interval between the adjacent through holes 602 in the plasmon filter 601. The interval is considerably preferable in a range from half of an effective wavelength of an electromagnetic wave in a medium to about one wavelength. Specifically, about 150 nm to 1000 nm is considered.

By installing the plasmon filter 601 in the inter-layer insulation film 202, a wavelength which is desired to be analyzed with the plasmon filter 601 can be selected from the light transmitted through a predetermined pixel of the upper substrate 111A and the selected light can be received with the photodiode 152. That is, it is possible to realize the image sensor 101 capable of selectively extracting the wavelength which is desired to be analyzed.

In the upper substrate 111A, the pixels are disposed in a 2-dimensional array form. Then, of the pixels disposed in the 2-dimensional array form, the openings 302 are installed in predetermined pixels set as the transmission pixels and the plasmon filters 601 are installed in the locations of the openings 302. Accordingly, the plurality of plasmon filters 601 are installed in the image sensor 101.

All the plurality of installed plasmon filters 601 may be set as the same filters. Also, by setting the plurality of installed plasmon filters 601 as filter that extract different wavelengths, it is possible to realize the image sensor 101 capable of extracting multi-spectrum or hyper-spectrum data.

Even in this case, since the plasmon filters 601 are installed between the upper substrate 111A and the lower substrate 111B, the plasmon filters 601 does not affect an image captured by the pixels of the upper substrate 111A and it is possible to prevent image quality from deteriorating.

Also, even in the case in which the plasmon filters 601 are installed, the openings 302 of the aperture 301 are disposed at the positions shifted in accordance with the image height with respect to the transmission pixels. Therefore, in a state in which the mixed color or the like does not occur, spectroscopy can be performed by the plasmon filters 601.

<Configuration in which Fabry-Pérot Interferometer is Included>

Figure 33:
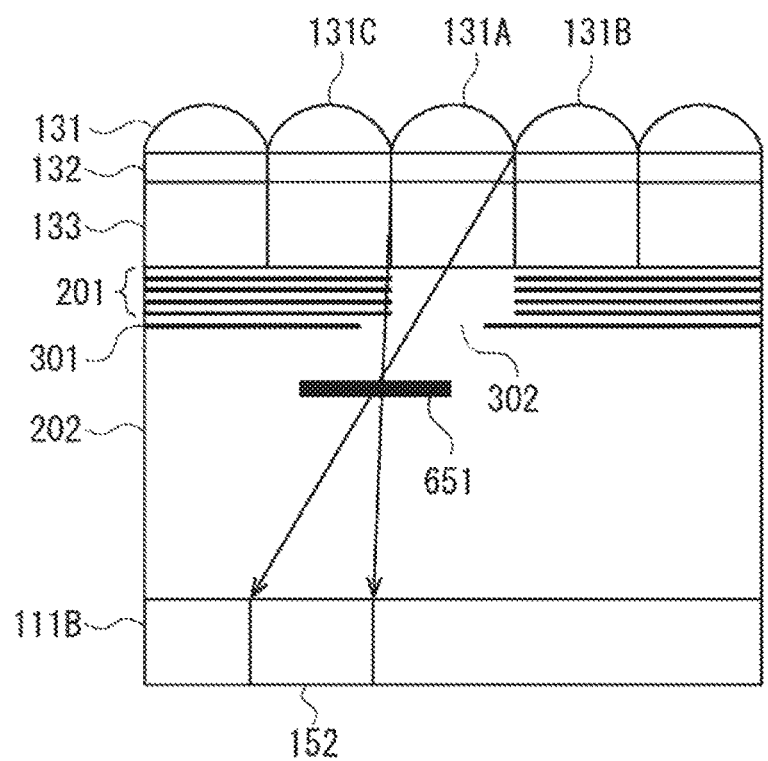
FIG. 33 is a diagram illustrating a configuration of an image sensor that includes a Fabry-Pérot interferometer.

FIG. 33 illustrates a configuration of the image sensor 101 in which a Fabry-Pérot interferometer is installed as a filter. The image sensor 101 illustrated in FIG. 33 is configured so that a Fabry-Pérot interferometer 651 is installed in the inter-layer insulation film 202 and incident light is incident on the photodiode 152 installed in the lower substrate 111B via the Fabry-Pérot interferometer 651.

Even in such a configuration, as described above, the openings 302 of the aperture 301 are shifted by the shift amount in accordance with the image height with respect to the transmission pixels to be disposed.

Figure 34:
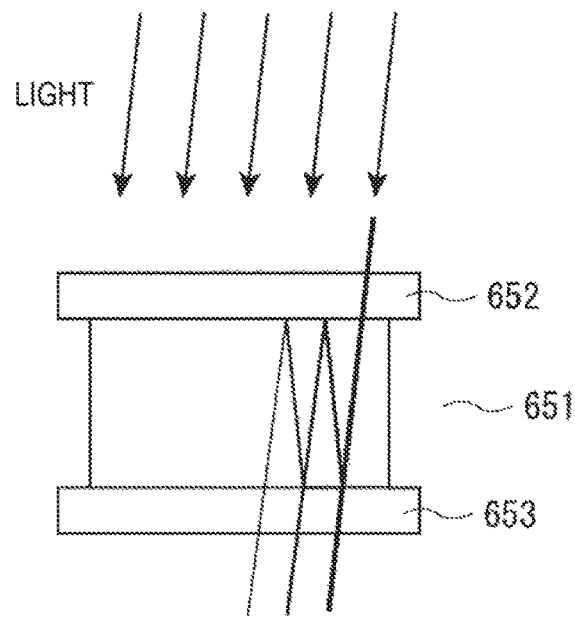
FIG. 34 is a diagram illustrating a configuration of the Fabry-Pérot interferometer.

As illustrated in FIG. 34, the Fabry-Pérot interferometer 651 is an optical device that is configured to include two semi-transparent mirrors 652 and 653 and in which the two semi-transparent mirrors 652 and 653 are disposed in parallel to face each other. The semi-transparent mirrors 652 and 653 are finished as reflective surfaces with high reflectance and slight transmittance.

Light incident from one side (in the drawing, the upper side) of the Fabry-Pérot interferometer 651 is reflected between both reflection surfaces several times, reciprocate, and interfere in each other. The light transmitted through the semi-transparent mirror 653 becomes interference light with a considerable length due to light reciprocating several times with a constant optical path difference. Accordingly, when this is used as a spectrometer, a considerably high resolution can be obtained.

By installing the Fabry-Pérot interferometer 651 in the inter-layer insulation film 202, a wavelength which is desired to be analyzed with the Fabry-Pérot interferometer 651 can be selected from the light transmitted through the transmission pixel of the upper substrate 111A and the selected light can be received with the photodiode 152. That is, it is possible to realize the image sensor 101 capable of selectively extracting the wavelength which is desired to be analyzed.

In the upper substrate 111A, the pixels are disposed in a 2-dimensional array form. Then, of the pixels disposed in the 2-dimensional array form, the openings 302 are installed in predetermined pixels set as the transmission pixels and the Fabry-Pérot interferometers 651 are installed in the locations of the openings 302. Accordingly, the plurality of Fabry-Pérot interferometers 651 are installed in the image sensor 101.

All the plurality of installed Fabry-Pérot interferometers 651 may be set as the same filters. Also, by setting the plurality of installed Fabry-Pérot interferometers 651 as filter that extract different wavelengths, it is possible to realize the image sensor 101 capable of extracting multi-spectrum or hyper-spectrum data.

Even in this case, since the Fabry-Pérot interferometers 651 are installed between the upper substrate 111A and the lower substrate 111B, the Fabry-Pérot interferometers 651 does not affect an image captured by the pixels of the upper substrate 111A and it is possible to prevent image quality from deteriorating.

Also, even in the case in which the Fabry-Pérot interferometers 651 are installed, the openings 302 of the aperture 301 are disposed at the positions shifted in accordance with the image height with respect to the transmission pixels. Therefore, in a state in which the mixed color or the like does not occur, spectroscopy can be performed by the Fabry-Pérot interferometers 651.

<Configuration in which TOF Type Sensor is Included>

The pixels disposed in the lower substrate 111B may be used as a time to flight (TOF) type sensor. Even in such a configuration, as described above, the openings 302 of the aperture 301 are shifted by the shift amounts in accordance with the image height with respect to the transmission pixels to be disposed.

Figure 35:
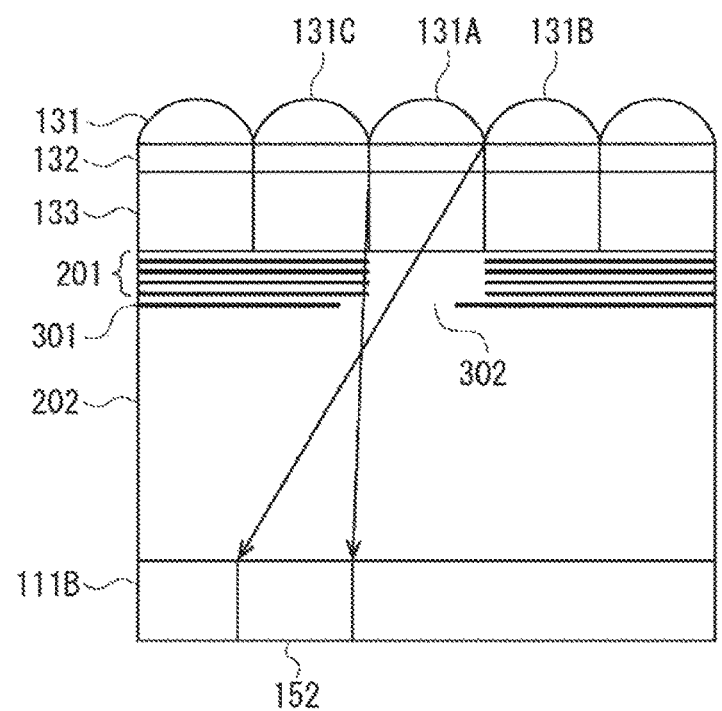
FIG. 35 is a diagram illustrating a configuration of an image sensor that includes a TOF type sensor.

In the image sensor 101 illustrated in FIG. 35, the photodiodes 152 installed in the lower substrate 111B are configured as a TOF type sensor. For example, the TOF type sensor is a sensor in which two pixels are paired and a distance is measured using the two pixels.

The TOF type sensor is a sensor that measures a distance to a target object by measuring a time in which light emitted from the TOF type sensor arrives at the target object, is reflected, and returns. For example, the TOF type sensor operates at a timing illustrated in FIG. 36.

Figure 36:
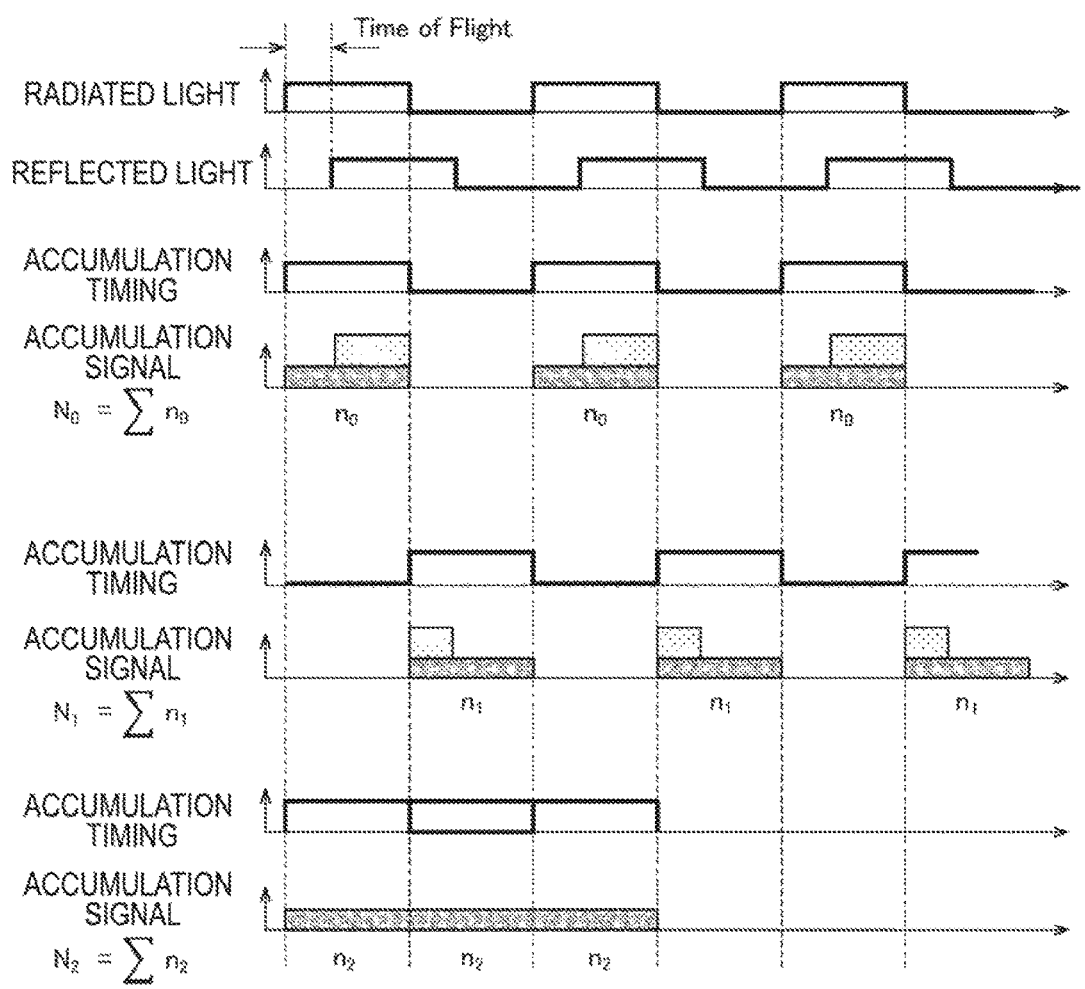
FIG. 36 is an explanatory diagram illustrating an operation of the TOF type sensor.

For example, here, the target object is irradiated with irradiated light by a predetermined time, here, a pulse emission time Tp. The emitted irradiated light arrives at the target object, is reflected, and returns. The reflected light is received by the photodiodes 152. As illustrated in FIG. 36, a time in which irradiation of the irradiated light starts and the reflected light is received is a time in accordance with the distance to the target object.

A first photodiode 152 receives light by the pulse emission time Tp from a time point at which the irradiation of the irradiated light starts. The received light is background light and reflected light. A signal n0 is acquired from an amount of received light accumulated when the light is received once.

A second photodiode 152 receives light by the pulse emission time Tp from a time point at which the reception of the light by the first photodiode 152 ends. The received light is background light and reflected light. A signal n1 is acquired from an amount of received light accumulated when the light is received once.

In this way, the signals n0 and n1 are acquired by performing driving so that a phase of an accumulation timing is completely reversed. The signals N0 and N1 are acquired by repeating the driving a plurality of times and accumulating and integrating the amounts of light. A distance D is calculated from the signals N0 and N1 which can be obtained in this way.

The signals N0 and N1 (signals n0 and n1) also include signals accumulated by receiving the background light. Therefore, since the signals remain from the reflected light excluding the background light, a signal N2 is acquired by accumulating and integrating the amounts of background light.

The distance D is calculated using the signals N0, N1, and N2 acquired in this way by the following Equations (1) and (2).

[Math. 1]

$$\Delta\phi = \frac{N_0 - N_2}{N_0 + N_1 - 2 \cdot N_2} \quad (1)$$

$$D = \frac{c \cdot T_p}{2}\left(1 - \frac{\Delta\phi}{2\pi}\right) \quad (2)$$

In Equations (1) and (2), D indicates a distance, c indicates a high speed, and Tp indicates a pulse emission time.

The photodiodes 152 disposed in the lower substrate 111B can be used as the TOF type sensor and configured to measure the distance D to a target object using the TOF type sensor. According to the present technology, there is no influence on the upper substrate 111A since the TOF type sensor is disposed in the lower substrate 111B. Accordingly, it is possible to realize the image sensor 101 capable of measuring the distance without having the influence on an image which can be obtained with the pixels of the upper substrate 111A.

Also, the sensor of the upper substrate 111A and the sensor of the lower substrate 111B can be separate sensors. That is, it is possible to realize the image sensor 101 that includes two independent sensors.

Figure 37:
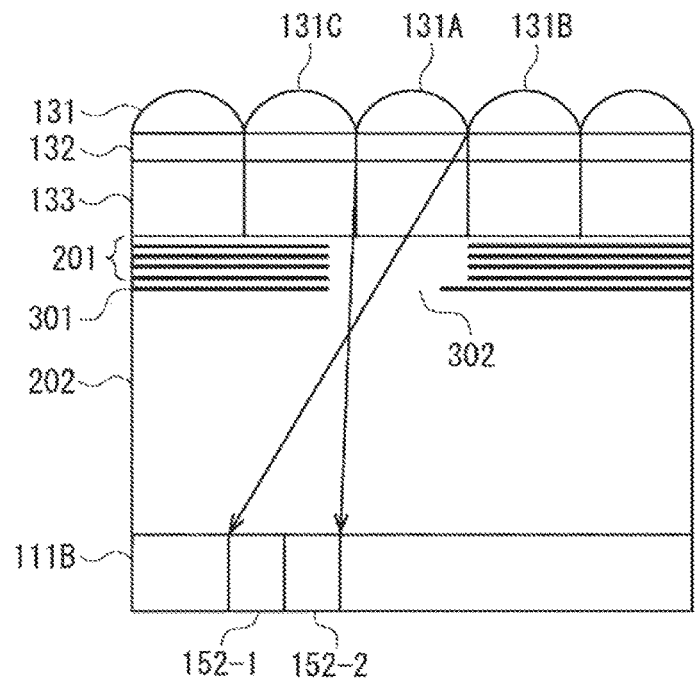
FIG. 37 is a diagram illustrating a configuration of an image sensor that includes an LFC type sensor.

As illustrated in FIG. 37, in the image sensor 101 to which the present technology is applied, light transmitted through the upper substrate 111A is received by the photodiodes 152 disposed in the lower substrate 111B. In a case in which the upper substrate 111A is formed of, for example, silicon, a visible light region with a short wavelength is absorbed. Near infrared light near 850 nm is used as irradiation light of the TOF type sensor in many cases.

Because of this fact, from this point, it is advantageous that the TOF type sensor in which light arriving at the lower substrate 111B is light from which the visible light region with the short wavelength region is excluded and the near infrared light near 850 nm is used in many cases is installed in the lower substrate 111B even when no filter or the like is used.

Also, even in the case in which the TOF type sensors are installed, the openings 302 of the aperture 301 are disposed at the positions shifted in accordance with the image height with respect to the transmission pixels. Therefore, in a state in which the mixed color or the like does not occur, a distance can be measured by the TOF type sensor.

<Configuration in which LFC Type Sensor is Included>

The pixels disposed in the lower substrate 111B may be used as a light field camera (LFC). Even in such a configuration, as described above, the openings 302 of the aperture 301 are shifted by the shift amounts in accordance with the image height with respect to the transmission pixels to be disposed.

In the image sensor 101 illustrated in FIG. 37, the photodiodes 152 installed in the lower substrate 111B configure a light field camera.

The light field camera is a camera that acquires multiple rays as light fields (ray space) and performs a kind of image processing on a set of the rays to obtain a final image. As a main function of the light field camera, there is a refocusing function of generating an image in which a camera focal distance is changed through post-processing after photographing. The light field camera can be configured in the lower substrate 111B.

In the light field camera, it is necessary to receive light transmitted through one on-chip lens 131 with the plurality of pixels. A configuration in which light is received with two pixels of the photodiodes 152-1 and 152-2 is illustrated in FIG. 37, but the number of pixels equal to or greater than 4×4 is considered. Also, when light transmitted through one on-chip lens 131 (transmission pixel) is received with a plurality of pixels (photodiodes 152), stereo images can be obtained by the number of pixels. By obtaining the plurality of stereo images, it is possible to realize the refocusing function, as described above.

In this way, according to the present technology, the photodiodes 152 disposed in the lower substrate 111B can be configured to be used as the light field camera. According to the present technology, there is no influence on the upper substrate 111A since the light field camera is disposed in the lower substrate 111B. Accordingly, it is possible to realize the image sensor 101 capable of measuring a distance without having the influence on an image which can be obtained with the pixels of the upper substrate 111A.

Also, the sensor of the upper substrate 111A and the sensor of the lower substrate 111B can be separate sensors. That is, it is possible to realize the image sensor 101 that includes two independent sensors.

Also, even in the case in which the light field cameras are installed, the openings 302 of the aperture 301 are disposed at the positions shifted in accordance with the image height with respect to the transmission pixels. Therefore, in a state in which the mixed color or the like does not occur, images can be captured by the light field cameras.

<Configuration in which Image is Captured in Two Layers>

The pixels disposed in the lower substrate 111B may be used as pixels with which a normal image is captured as in the pixels disposed in the upper substrate 111A. Even in such a configuration, as described above, the openings 302 of the aperture 301 are shifted by the shift amounts according to the image height with respect to the transmission pixels to be disposed.

Figure 38:
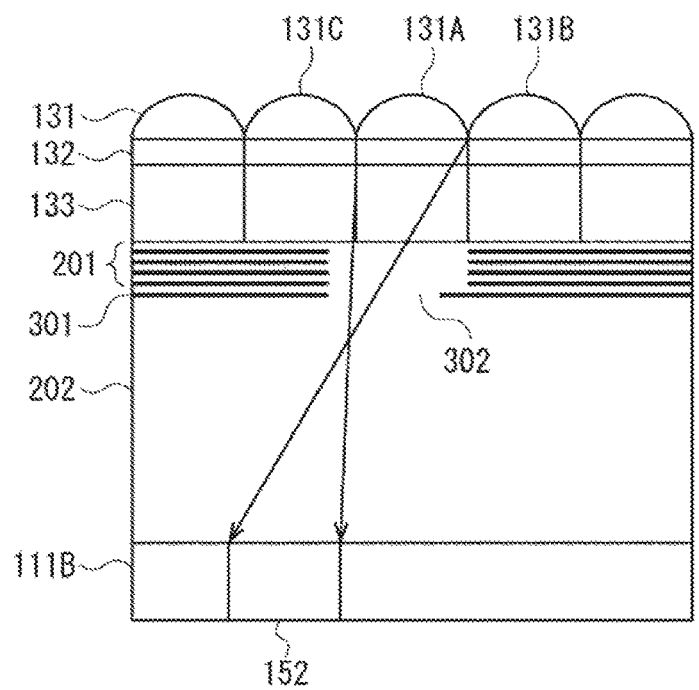
FIG. 38 is a diagram illustrating a configuration of an image sensor when imaging is performed with two layers.

In the image sensor 101 illustrated in FIG. 38, the photodiodes 152 installed in the lower substrate 111B are used as pixels with which a normal image is captured.

That is, the image sensor 101 illustrated in FIG. 38 is configured so that the same image can be captured with the upper substrate 111A and the lower substrate 111B. Even in such a configuration, an image captured with the lower substrate 111B may be used for an image displayed on the display unit 25 (see FIG. 1) of the image sensor 10.

On the display unit 25, a preview image is displayed at the time of photographing of an image. An image in which an image captured with the pixels of the upper substrate 111A is decimated is considered to be used as the preview image.

As in the embodiment, by realizing a configuration in which imaging is performed with the pixels in two layers, it is possible to perform separate uses in which an image captured with the pixels in one layer is set as a preview image and an image captured with the pixels in the other layer is set as a recording image. Here, the example in which the recording image is captured with the pixels of the upper substrate 111A and the image for the preview image is captured with the pixels of the lower substrate 111B has been described.

Also, by realizing the configuration in which imaging is performed with the pixels in two layers, it is possible to set an image captured with the pixels in one layer as a moving image and set an image captured with the pixels in the other layer as a still image. For example, it is possible to realize a configuration in which a still image is captured with the pixels of the upper substrate 111A and a moving image is captured with the pixels of the lower substrate 111B.

Also, it is also possible to simultaneously image light with different wavelengths so that an image of the visible light is captured with the pixels of the upper substrate 111A and an image of the near infrared light is simultaneously captured with the pixels of the lower substrate 111B.

Since the images are captured with the pixels disposed in the different layers, both good images can be acquired without being mutually affected.

Also, even in a case in which images are captured with the pixels disposed in two layers, as in the foregoing case, the openings 302 of the aperture 301 are disposed at the positions shifted in accordance with the image height with respect to the transmission pixels. Therefore, the image captured with the pixels of each layer can be obtained in a state in which mixed color or the like does not occur.

<Other Configurations>

Figure 39:
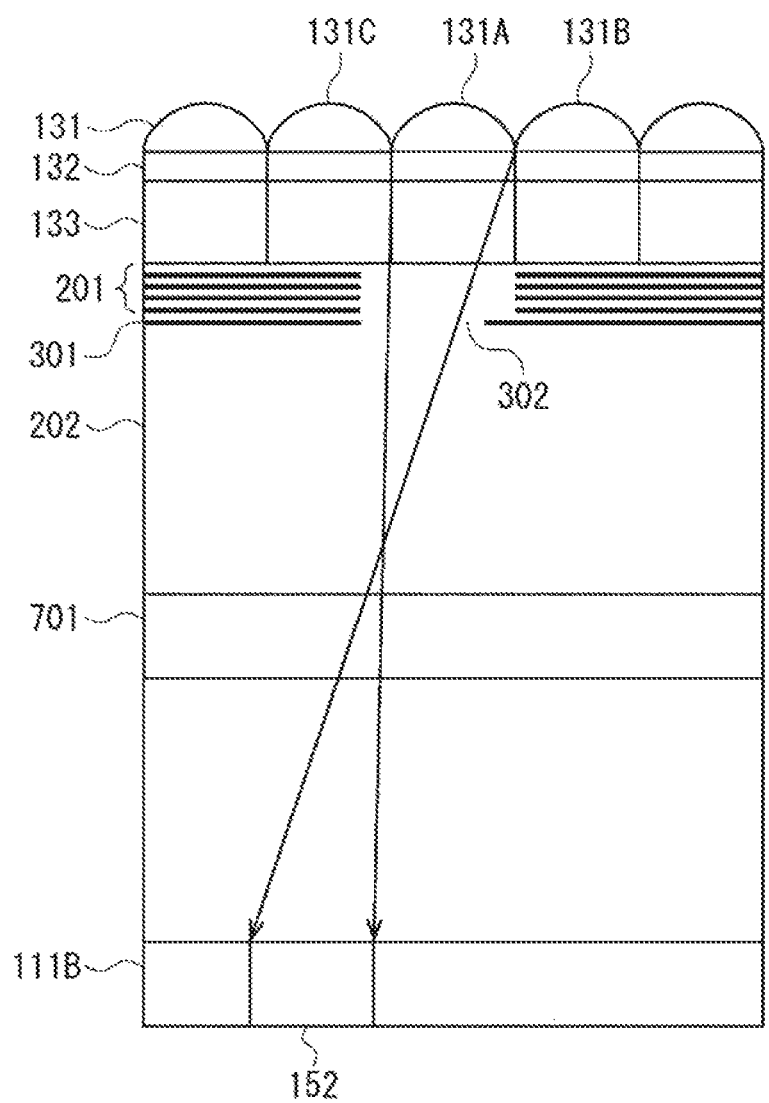
FIG. 39 is an explanatory diagram illustrating another configuration of the image sensor.

In the above-described embodiment, the example in which the image sensor 101 is configured with two layers of the upper substrate 111A and the lower substrate 111B has been described. However, as illustrated in FIG. 39, the image sensor may be configured with three layers. In the example illustrated in FIG. 38, the image sensor 101 has a configuration of three layers in which a substrate 701 is installed between the upper substrate 111A and the lower substrate 111B.

In this way, the present technology can be applied to a multi-layered structure such as a 3-layered structure without being limited to two layers. Also, it is also possible to realize a configuration in which a through port is formed in silicon and sufficient light is transmitted up to a lower layer, for example, in a case in which the sufficient light is not transmitted up to the lower layer due to absorption of the light by the silicon in a halfway layer.

Figure 40:
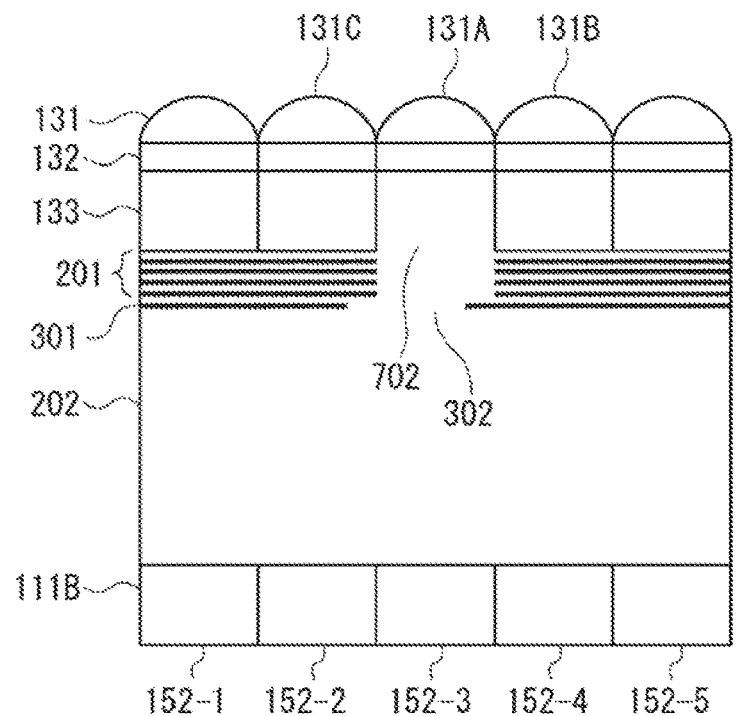
FIG. 40 is an explanatory diagram illustrating another configuration of the image sensor.

Also, even in the case of two layers, as illustrated in FIG. 40, a through port may be formed. In the image sensor 101 illustrated in FIG. 40, a through port 702 is formed in silicon of the upper substrate 111A set as a transmission pixel. By forming the through port 702, it is easy for light to be transmitted up to the lower substrate 111B via the through port 702. For example, it is possible to realize the image sensor 101 in which the visible light or the like with a short wavelength is also easily received with the lower substrate 111B.

The color of the on-chip color filter 132 of the transmission pixel may be one of so-called RGB, red, green, and blue or may be further white (W) or transparent. In particular, in a case in which the color of the on-chip color filter is set to be white (transparent), detection can be performed with high sensitivity even in the pixels (sensor) in second layer transition.

Figure 41:
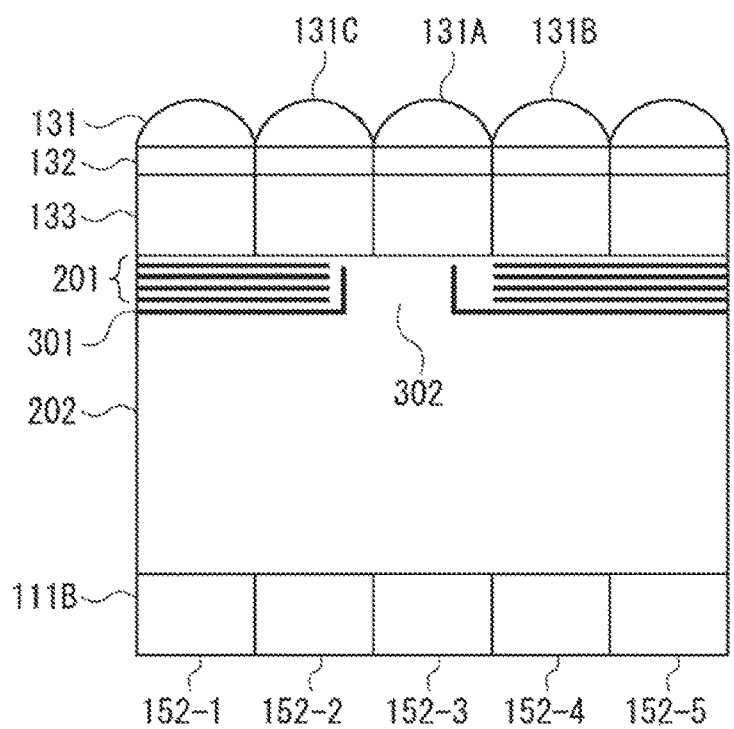
FIG. 41 is an explanatory diagram illustrating another configuration of the image sensor.

In the above-described embodiment, the example in which the openings 302 of the aperture 301 are configured to be planar (2-dimensional) has been described. However, as illustrated in FIG. 41, the openings may be configured to be 3-dimensional. In the openings 302 illustrated in FIG. 41, metal is formed in the upward direction in the drawing and metal is formed not only in the lateral direction (the horizontal direction) but also in the longitudinal direction (the vertical direction).

In this way, by configuring the openings 302 to be 3-dimensional, it is possible to further suppress mixed color from the adjacent pixels.

In addition, in the above-described configuration, the aperture 301 formed of metal has been described. However, the aperture can also be formed of a material other than metal as long as light is not transmitted through the material. Here, in a case in which the aperture 301 is installed as a part of the multilayer wiring layer 201, it is necessary to have conductivity.

According to the present technology, as described above, by configuring the openings 302 of the aperture 301 (the multilayer wiring layer 201) to be left-right asymmetric, it is possible to realize a configuration in which unnecessary light of mixed color or the like from the adjacent pixels can be cut and necessary light can be further acquired. Also, it is also possible to correspond to even light of a high angle of incidence.

Also, in various sensors and, particularly, in phase difference sensors, it is possible to generate a sensor in which a separation ratio is high up to a high angle of incidence.

<Usage Examples of Image Sensor>

Figure 42:
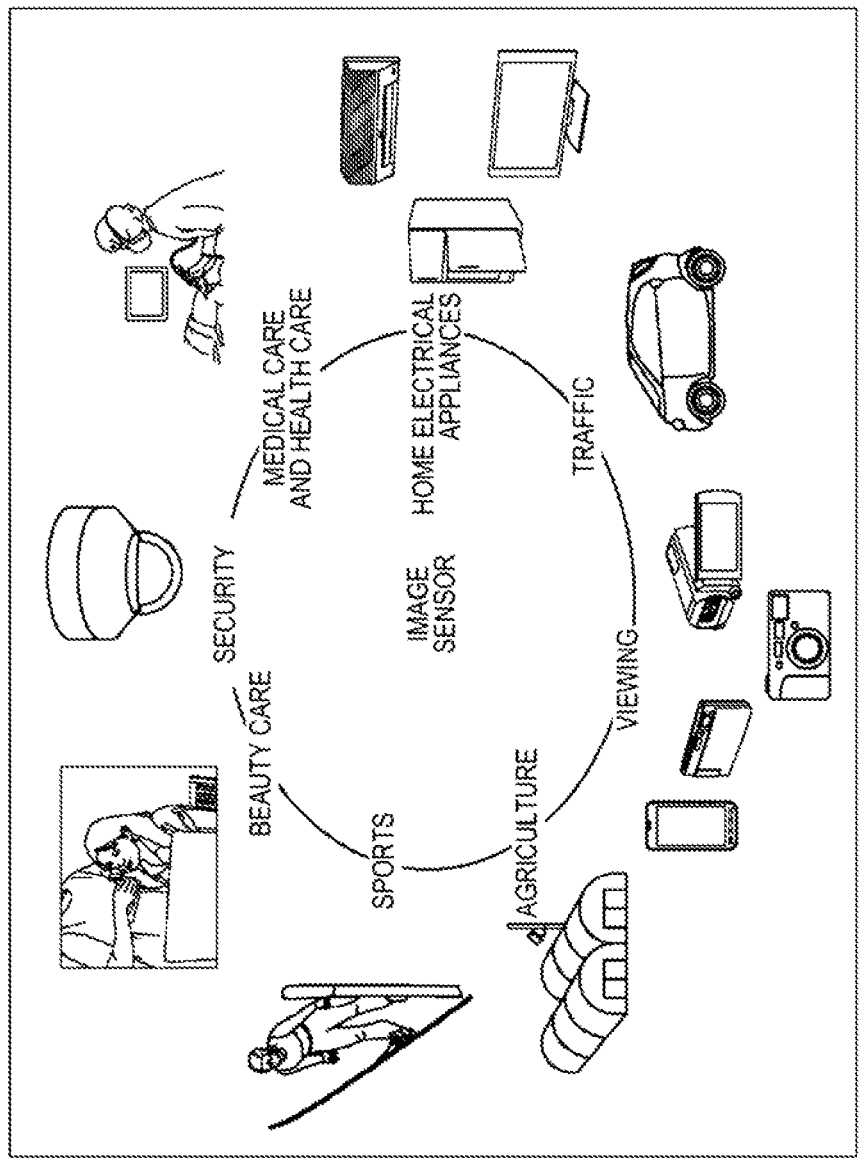
FIG. 42 is an explanatory diagram illustrating a use example of the image sensor.

FIG. 42 illustrates the usage examples of the above-described image sensor and an electronic device including an image sensor.

The above-described image sensor can be used for, for example, various cases in which light such as visible light, infrared light, ultraviolet light, or X-rays is detected as follows.

Devices that take images used for viewing, such as a digital camera and a portable appliance with a camera function.

Devices used for traffic, such as an in-vehicle sensor that takes images of the front and the back of a car, surroundings, the inside of the car, and the like, a monitoring camera that monitors travelling vehicles and roads, and a distance sensor that measures distances between vehicles and the like, which are used for safe driving (e.g., automatic stop), recognition of the condition of a driver, and the like.

Devices used for home electrical appliances, such as a TV, a refrigerator, and an air conditioner, to takes images of a gesture of a user and perform appliance operation in accordance with the gesture.

Devices used for medical care and health care, such as an endoscope and a device that performs angiography by reception of infrared light.

Devices used for security, such as a monitoring camera for crime prevention and a camera for personal authentication.

Devices used for beauty care, such as skin measurement equipment that takes images of the skin and a microscope that takes images of the scalp.

Devices used for sports, such as an action camera and a wearable camera for sports and the like.

Devices used for agriculture, such as a camera for monitoring the condition of the field and crops.

Further, in the present specification, a system means the whole apparatus configured by a plurality of devices.

In addition, the effects described in the present specification are not limiting but are merely examples, and there may be additional effects.

An embodiment of the disclosure is not limited to the embodiments described above, and various changes and modifications may be made without departing from the scope of the disclosure.

Additionally, the present technology may also be configured as below.

(1)

An image sensor, in which photoelectric conversion layers including photoelectric conversion units separated in units of pixels are stacked in two or more layers, the image sensor is configured to include a state in which light incident on one pixel in a first photoelectric conversion layer closer to an optical lens is received by the photoelectric conversion unit in a second photoelectric conversion layer distant from the optical lens, the image sensor includes a light-shielding layer configured to shield light transmitted through the first photoelectric conversion layer, between the first photoelectric conversion layer and the second photoelectric conversion layer, the light-shielding layer has an opening to transmit the light from the first photoelectric conversion layer to the second photoelectric conversion layer, and the openings are made to be asymmetric with respect to the pixel in the first photoelectric conversion layer.

(2)

The image sensor according to (1), in which the openings have different asymmetry in accordance with an image height of the optical lens.

(3)

The image sensor according to (1) or (2), in which asymmetry of the openings increases when an image height of the optical lens is raised.

(4)

The image sensor according to any of (1) to (3), in which sides that form the opening are disposed at positions shifted from sides that form a pixel in the first photoelectric conversion layer in which the opening is located, and among the sides that form the opening, a first side located on a central side of the optical lens and a second side different from the first side are shifted by different shift amounts.

(5)

The image sensor according to (4), in which the shift is performed in a horizontal direction.

(6)
The image sensor according to (4),
in which the shift is performed in a horizontal direction and a diagonal direction.
(7)
The image sensor according to (4),
in which the shift is performed in a vertical direction.
(8)
The image sensor according to (4),
in which the shift is performed in a vertical direction and a diagonal direction.
(9)
The image sensor according to (4),
in which the shift is performed in at least one of a horizontal direction, a vertical direction, and a diagonal direction.
(10)
The image sensor according to any of (1) to (9),
in which a pixel of the photoelectric conversion unit in the second photoelectric conversion layer is a phase difference detection pixel.
(11)
The image sensor according to any of (1) to (9), further including:
a light-shielding unit configured to shield light transmitted through the opening, between the light-shielding layer and the second photoelectric conversion layer,
in which the pixel of the photoelectric conversion unit in the second photoelectric conversion layer is configured in a state in which the light is half shielded by the light-shielding unit, and
the pixel of the photoelectric conversion unit in the second photoelectric conversion layer is set as a phase difference detection pixel.
(12)
The image sensor according to any of (1) to (9), further including:
a light-shielding unit formed between the first photoelectric conversion layer and the second photoelectric conversion layer in a grid state in which the light transmitted through the first photoelectric conversion layer is shielded.
(13)
The image sensor according to (12),
in which grids of the light-shielding units disposed to be adjacent to each other are grids in different directions.
(14)
The image sensor according to any of (1) to (9), further including:
a narrow-band filter between the first photoelectric conversion layer and the second photoelectric conversion layer,
in which the light transmitted through the first photoelectric conversion layer arrives at the photoelectric conversion unit of the second photoelectric conversion layer via the filter.
(15)
The image sensor according to any of (1) to (9), further including:
a plasmon filter between the first photoelectric conversion layer and the second photoelectric conversion layer,
in which the light transmitted through the first photoelectric conversion layer arrives at the photoelectric conversion unit of the second photoelectric conversion layer via the plasmon filter.
(16)
The image sensor according to any of (1) to (9), further including:
a Fabry-Pérot interferometer between the first photoelectric conversion layer and the second photoelectric conversion layer,
in which the light transmitted through the first photoelectric conversion layer arrives at the photoelectric conversion unit of the second photoelectric conversion layer via the Fabry-Pérot interferometer.
(17)
The image sensor according to any of (1) to (9),
in which the photoelectric conversion unit in the second photoelectric conversion layer forms a time of flight (TOF) type sensor.
(18)
The image sensor according to any of (1) to (9),
in which the photoelectric conversion unit in the second photoelectric conversion layer forms a light field camera.
(19)
The image sensor according to any of (1) to (9),
in which the photoelectric conversion unit in the second photoelectric conversion layer is used as a sensor that images a subject and acquires an image.
(20)
An electronic device including:
an image sensor,
in which photoelectric conversion layers including photoelectric conversion units separated in units of pixels are stacked in two or more layers,
the image sensor is configured to include a state in which light incident on one pixel in a first photoelectric conversion layer closer to an optical lens is received by the photoelectric conversion unit in a second photoelectric conversion layer distant from the optical lens,
the image sensor includes a light-shielding layer configured to shield light transmitted through the first photoelectric conversion layer, between the first photoelectric conversion layer and the second photoelectric conversion layer,
the light-shielding layer has an opening to transmit the light from the first photoelectric conversion layer to the second photoelectric conversion layer, and
the openings are made to be asymmetric with respect to the pixel in the first photoelectric conversion layer.

REFERENCE SIGNS LIST 10 imaging device
21 lens group
22 image sensor
101 image sensor
102 optical lens
111A upper substrate
111B lower substrate
131 on-chip lens
132 on-chip color filter
133 photodiode
151 pixel group
152 photodiode
301 aperture
302 opening

The invention claimed is:
1. An image sensor, comprising:
a plurality of photoelectric conversion layers including a plurality of photoelectric conversion units, wherein
the plurality of photoelectric conversion units is separated in units of pixels,
the plurality of photoelectric conversion layers comprise a plurality of pixels that is stacked in at least two layers, a first pixel of the plurality of pixels, in a first photoelectric conversion layer of the plurality of photoelectric conversion layers, is configured to receive incident light,
the first photoelectric conversion layer is closer to an optical lens,
a first photoelectric conversion unit of the plurality of photoelectric conversion units, in a second photoelectric conversion layer of the plurality of photoelectric conversion layers, is configured to receive the incident light transmitted through the first photoelectric conversion layer, and
the second photoelectric conversion layer is distant from the optical lens; and
a light-shielding layer configured to shield the light transmitted through the first photoelectric conversion layer, wherein
the light-shielding layer is between the first photoelectric conversion layer and the second photoelectric conversion layer,
the light-shielding layer is further configured to transmit the incident light from the first photoelectric conversion layer to the second photoelectric conversion layer through an opening in the light-shielding layer, and
the opening is asymmetric with respect to the first pixel in the first photoelectric conversion layer.

2. The image sensor according to claim 1, wherein the asymmetry of the opening with respect to the first pixel is based on an image height of the optical lens.

3. The image sensor according to claim 1, wherein the asymmetry of the opening with respect to the first pixel increases based on an increase in an image height of the optical lens.

4. The image sensor according to claim 1, wherein
a first plurality of sides surrounding the opening is at a plurality of positions that is shifted from a second plurality of sides,
the second plurality of sides is of the first pixel in the first photoelectric conversion layer,
wherein a first side of the first plurality of sides is located on a central side of the optical lens,
a second side, of the first plurality of sides, is different from the first side,
the first side is shifted by a first shift amount and the second side is shifted by a second shift amount, and
the first shift amount is different from the second shift amount.

5. The image sensor according to claim 4, wherein the shift is in a horizontal direction.

6. The image sensor according to claim 4, wherein the shift is in a horizontal direction and a diagonal direction.

7. The image sensor according to claim 4, wherein the shift is in a vertical direction.

8. The image sensor according to claim 4, wherein the shift is in a vertical direction and a diagonal direction.

9. The image sensor according to claim 4, wherein the shift is in at least one of a horizontal direction, a vertical direction, or a diagonal direction.

10. The image sensor according to claim 1, wherein a second pixel of the first photoelectric conversion unit in the second photoelectric conversion layer is a phase difference detection pixel.

11. The image sensor according to claim 1, further comprising
a light-shielding unit configured to shield the light transmitted through the opening, the light-shielding unit is between the light-shielding layer and the second photoelectric conversion layer, wherein
a second pixel of the first photoelectric conversion unit, is in a state in which the incident light is half shielded by the light-shielding unit, and
the first pixel is set as a phase difference detection pixel.

12. The image sensor according to claim 1, further comprising
a light-shielding unit in a grid state, wherein the light-shielding unit is between the first photoelectric conversion layer and the second photoelectric conversion layer, and wherein the light-shielding unit is configured to shield the light transmitted through the first photoelectric conversion layer.

13. The image sensor according to claim 12,
wherein the light-shielding unit includes a plurality of grids is adjacent to each other and in different directions.

14. The image sensor according to claim 1, further comprising
a narrow-band filter between the first photoelectric conversion layer and the second photoelectric conversion layer,
wherein the light transmitted through the first photoelectric conversion layer arrives at the first photoelectric conversion unit of the second photoelectric conversion layer through the narrow-band filter.

15. The image sensor according to claim 1, further comprising
a plasmon filter between the first photoelectric conversion layer and the second photoelectric conversion layer,
wherein the light transmitted through the first photoelectric conversion layer arrives at the first photoelectric conversion unit of the second photoelectric conversion layer through the plasmon filter.

16. The image sensor according to claim 1, further comprising:
a Fabry-Perot interferometer between the first photoelectric conversion layer and the second photoelectric conversion layer,
wherein the light transmitted through the first photoelectric conversion layer arrives at the first photoelectric conversion unit of the second photoelectric conversion layer through the Fabry-Perot interferometer.

17. The image sensor according to claim 1,
wherein the first photoelectric conversion unit in the second photoelectric conversion layer is a time of flight (TOF) type sensor.

18. The image sensor according to claim 1,
wherein the first photoelectric conversion unit in the second photoelectric conversion layer is a light field camera.

19. The image sensor according to claim 1,
wherein the first photoelectric conversion unit in the second photoelectric conversion layer is a sensor that images a subject and acquires an image.

20. An electronic device, comprising:
an image sensor comprising:
a plurality of photoelectric conversion layers including a plurality of photoelectric conversion units, wherein the plurality of photoelectric conversion units is separated in units of pixels, wherein the plurality of photoelectric conversion layers comprises a plurality of pixels that is stacked in at least two layers, wherein a first pixel of the plurality of pixels, in a first photoelectric conversion layer of the plurality of photoelectric conversion layers, is configured to receive incident light, the first photoelectric conversion layer is closer to an optical lens a first photoelectric conversion unit of the plurality of photoelectric conversion units, in a second photoelectric conversion layer of the plurality of photoelectric conversion layers, is configured to receive the incident light transmitted through the first photoelectric conversion layer, the second photoelectric conversion layer is distant from the optical lens; and a light-shielding layer configured to shield the light transmitted through the first photoelectric conversion layer, wherein the light-shielding layer is between the first photoelectric conversion layer and the second photoelectric conversion layer, the light-shielding layer is further configured to transmit the incident light from the first photoelectric conversion layer to the second photoelectric conversion layer through an opening in the light-shielding layer, and the opening is asymmetric with respect to the first pixel in the first photoelectric conversion layer.

* * * * *